US011158524B2

(12) United States Patent
Rangarajan et al.

(10) Patent No.: US 11,158,524 B2
(45) Date of Patent: Oct. 26, 2021

(54) NON-CONTACT CLEAN MODULE

(71) Applicant: Applied Materials, Inc., Santa Clara, CA (US)

(72) Inventors: Jagan Rangarajan, San Jose, CA (US); Adrian Blank, Gilroy, CA (US); Edward Golubovsky, San Jose, CA (US); Balasubramaniam Coimbatore Jaganathan, Santa Clara, CA (US); Steven M. Zuniga, Soquel, CA (US); Ekaterina Mikhaylichenko, San Jose, CA (US); Michael A. Anderson, Santa Clara, CA (US); Jonathan P. Domin, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/532,730

(22) Filed: Aug. 6, 2019

(65) Prior Publication Data
US 2020/0043756 A1 Feb. 6, 2020

Related U.S. Application Data

(60) Provisional application No. 62/795,816, filed on Jan. 23, 2019, provisional application No. 62/756,158, filed on Nov. 6, 2018.

(30) Foreign Application Priority Data

Aug. 6, 2018 (IN) .............................. 201841029454

(51) Int. Cl.
*H01L 21/67* (2006.01)
*B08B 3/02* (2006.01)
(Continued)

(52) U.S. Cl.
CPC ........ *H01L 21/67051* (2013.01); *B08B 3/022* (2013.01); *B08B 5/023* (2013.01);
(Continued)

(58) Field of Classification Search
None
See application file for complete search history.

(56) References Cited

U.S. PATENT DOCUMENTS 6,159,541 A * 12/2000 Sakai ...................... B05C 11/08
427/240
6,361,422 B1 * 3/2002 Ettinger ................. B24B 37/345
451/287
(Continued)

FOREIGN PATENT DOCUMENTS

| JP | H09-171984 A | 6/1997 |
| JP | 2013-131783 A | 7/2013 |
| KR | 101619166 B1 | 5/2016 |

OTHER PUBLICATIONS

PCT Notification of Transmittal of the International Search Report and the Written Opinion of the International Searching Authority for International Application No. PCT/US2019/045147; dated Nov. 20, 2019; 11 total pages.

*Primary Examiner* — Douglas Lee
*Assistant Examiner* — Pradhuman Parihar
(74) *Attorney, Agent, or Firm* — Patterson + Sheridan, LLP

(57) ABSTRACT

A cleaning module for cleaning a wafer comprises a wafer gripping device configured to support a wafer in a vertical orientation and comprises a catch cup and a gripper assembly. The catch cup comprises a wall that has an annular inner surface that defines a processing region and has an angled portion that is symmetric about a central axis of the wafer gripping device. The gripper assembly comprises a first plate assembly, a second plate assembly, a plurality of gripping (Continued)

pin, and a plurality of loading pin. The gripping pins are configured to grip a wafer during a cleaning process and the loading pins are configured to grip the wafer during a loading and unloading process. The cleaning module further comprises a sweep arm coupled to a nozzle mechanism configured to deliver liquids to the front and back side of the wafer.

16 Claims, 27 Drawing Sheets

(51) Int. Cl.
  *B08B 5/02* (2006.01)
  *H01L 21/02* (2006.01)
  *H01L 21/687* (2006.01)

(52) U.S. Cl.
  CPC .. *H01L 21/02057* (2013.01); *H01L 21/68764* (2013.01); *B08B 2203/0288* (2013.01)

(56) References Cited

U.S. PATENT DOCUMENTS

| | | |
|---|---|---|
| 7,527,694 B2 | 5/2009 | Sundar |
| 7,849,865 B2 | 12/2010 | Harris |
| 8,541,309 B2 | 9/2013 | Rye et al. |
| 9,799,537 B2 | 10/2017 | Rye et al. |
| 2011/0048469 A1* | 3/2011 | Ogata ............... H01L 21/67051 134/33 |
| 2014/0259728 A1* | 9/2014 | Ishibashi ........... H01L 21/02054 34/381 |

\* cited by examiner

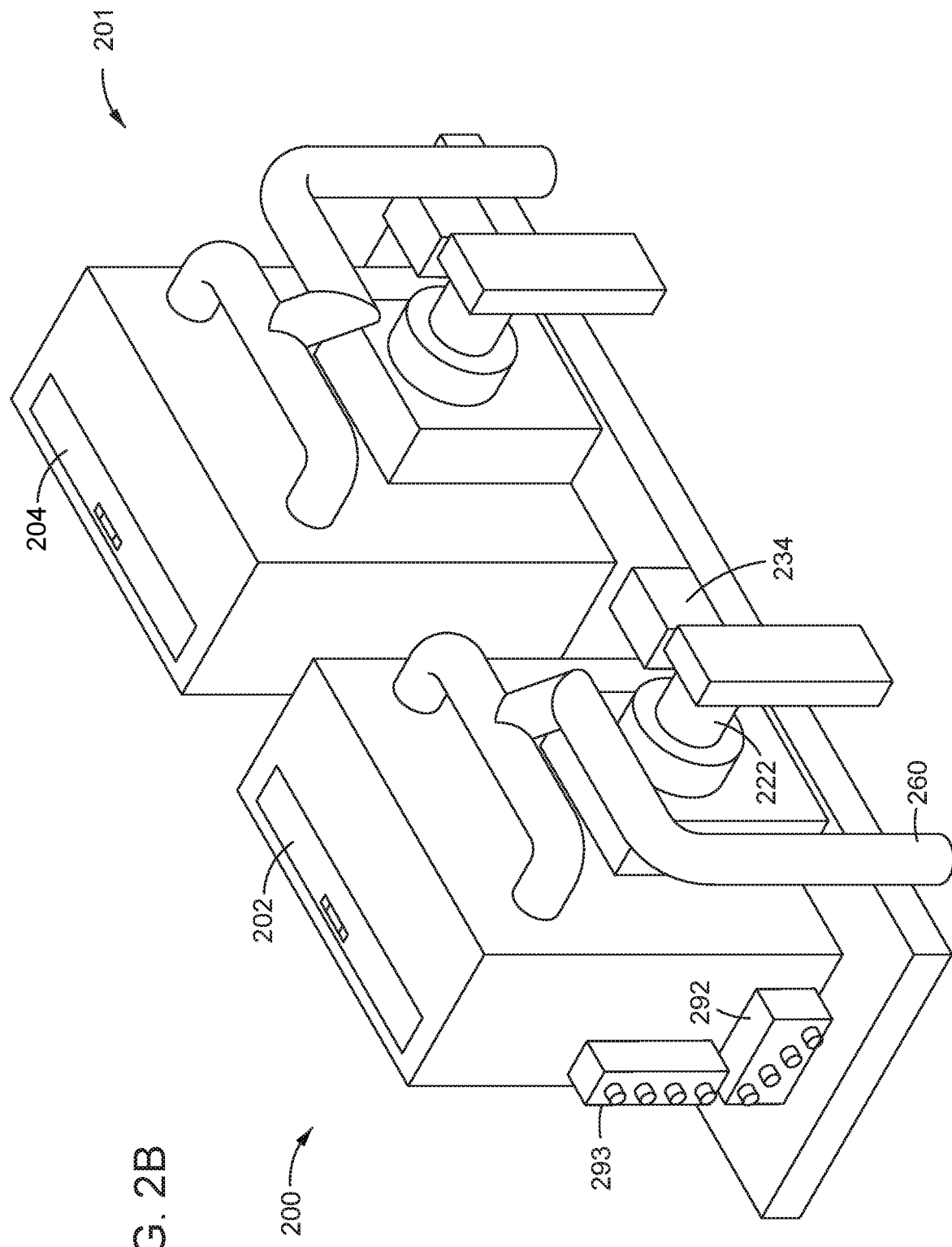

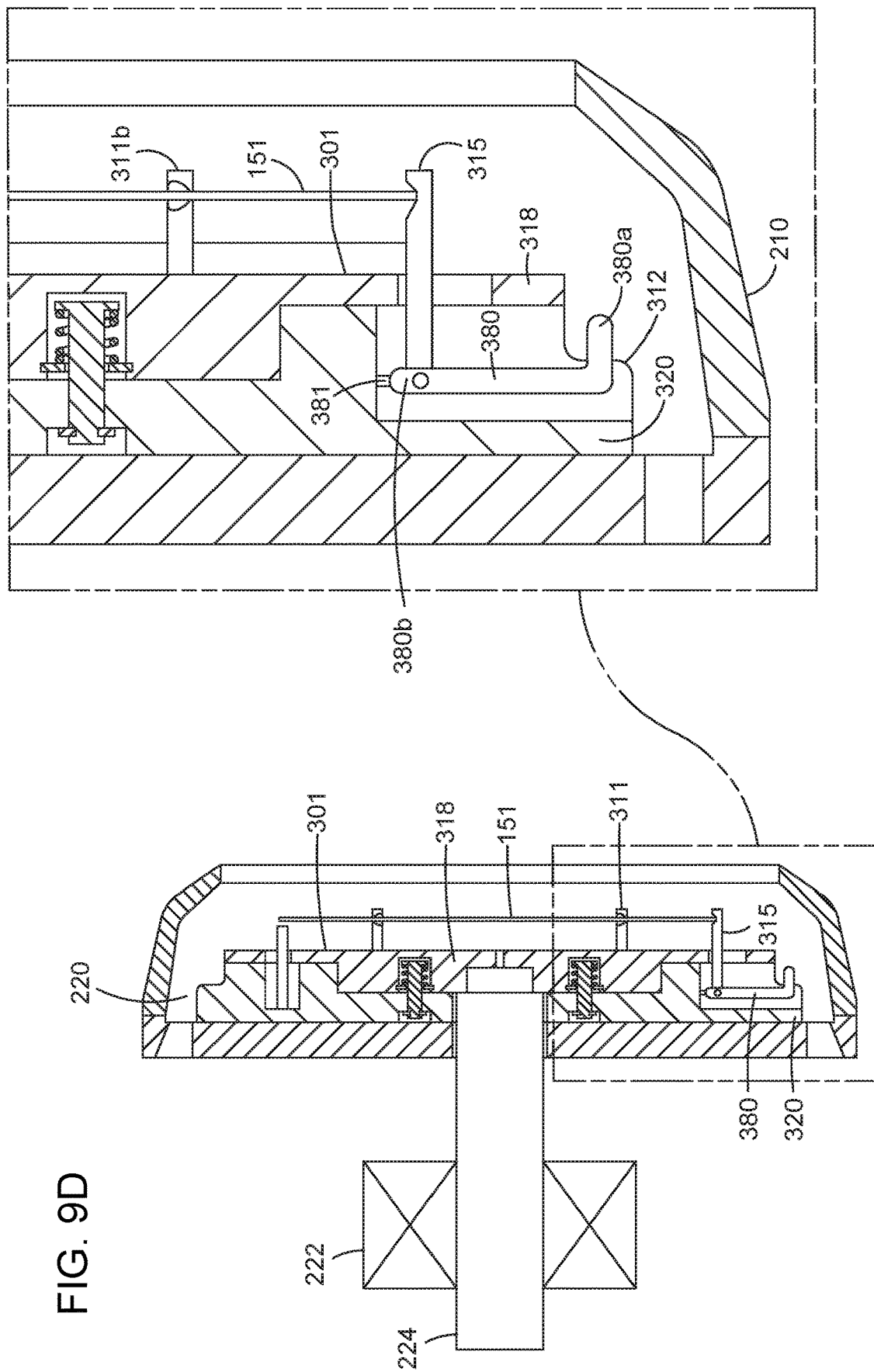

NON-CONTACT CLEAN MODULE

CROSS-REFERENCE TO RELATED APPLICATION

The present application claims benefit of U.S. Provisional Patent Application Ser. No. 62/756,158, filed Nov. 6, 2018, and U.S. Provisional Patent Application No. 62/795,816, filed Jan. 23, 2019, and Indian Patent Application No. 201841029454 filed Aug. 6, 2018, the contents of which are herein incorporated by reference in their entireties.

BACKGROUND

Field

Embodiments of the present disclosure generally relate to apparatus and methods for cleaning processed wafers, and, more particularly, to a non-contact cleaning system and method for processing wafers.

Description of the Related Art

In various instances, wafers are cleaned to remove any contamination from the wafer, before the wafer is processed for use in an electrical device. In one or more embodiments, cleaning methods such as chemical buffing and/or brush scrubbing may be utilized to clean the wafers. However, these cleaning methods may lead to particles becoming reattached to the wafer after the corresponding cleaning process. For example, the contacting medium for these cleaning processes (e.g., buff pass and/or cleaning brush) may be a source of contamination. The particles may lead to the wafer being unable to support processing to include analog, logic and/or advanced memory applications. As such, the yield for the processed wafers will be negatively impacted.

Thus, there is a need for an improved cleaning process that may be used to remove particles from the cleaned wafers, before the wafers undergo further processing.

SUMMARY

In one example, a cleaning module comprises a wafer gripping device. The wafer gripping device is configured to support a wafer in a vertical orientation and comprises a catch cup and a gripper assembly. The catch cup comprises a wall that has an annular inner surface. The annular inner surface defines a processing region and has an angled portion that is symmetric about a central axis of the wafer gripping device. The gripper assembly comprises a first plate assembly, a second plate assembly, gripping pins, and loading pins. The gripping pins are of the second plate assembly and the loading pins are of the first plate assembly. The gripper assembly is configured to be positioned in a loading position, rinsing position and a cleaning position. When in the cleaning position, the gripper assembly is disposed within the processing region. Further, when the gripper assembly is in the loading position the gripping pins are a first distance from a center of the gripper assembly, and when the gripper assembly is in the cleaning position, the gripping pins are a second distance from the central axis of the wafer gripping device. The first distance is greater than the second distance. Additionally, when the gripper assembly is in the loading position and the cleaning position the loading pins are each a third distance from the central axis.

In one example, a method for cleaning a wafer in a cleaning module comprising a wafer gripping device comprises moving a first plate assembly of a gripper assembly away from a second plate assembly of the gripper assembly and toward an annular inner surface of a catch cup of the wafer gripping device to position the gripper assembly in a loading position. The wafer is received in a vertical orientation by a plurality of loading pins of the first plate assembly. Further, moving the first plate assembly away from the second plate assembly positions a plurality of gripping pins of the second plate assembly a first distance from a central axis of the wafer gripping device. Additionally, the annular inner surface has an angled portion that is symmetric about the central axis and the annular inner surface defines a processing region. The method further comprises moving the first plate assembly toward the second plate assembly and away from the annular inner surface to position the gripper assembly in a cleaning position. Further, the plurality of gripping pins is positioned a second distance from the central axis and grip the wafer in response to moving the first plate assembly of the gripper assembly toward the second plate assembly. The first distance is greater than the second distance. Additionally, the method comprises rotating the gripper assembly, the catch cup and the wafer simultaneously during a cleaning process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIG. 2B illustrates a schematic view of cleaning modules, according to one or more embodiments.

FIGS. 9A, 9B, 9C, and 9D illustrate various examples of a wafer gripper device, according to one or more embodiments.

Figure 1:
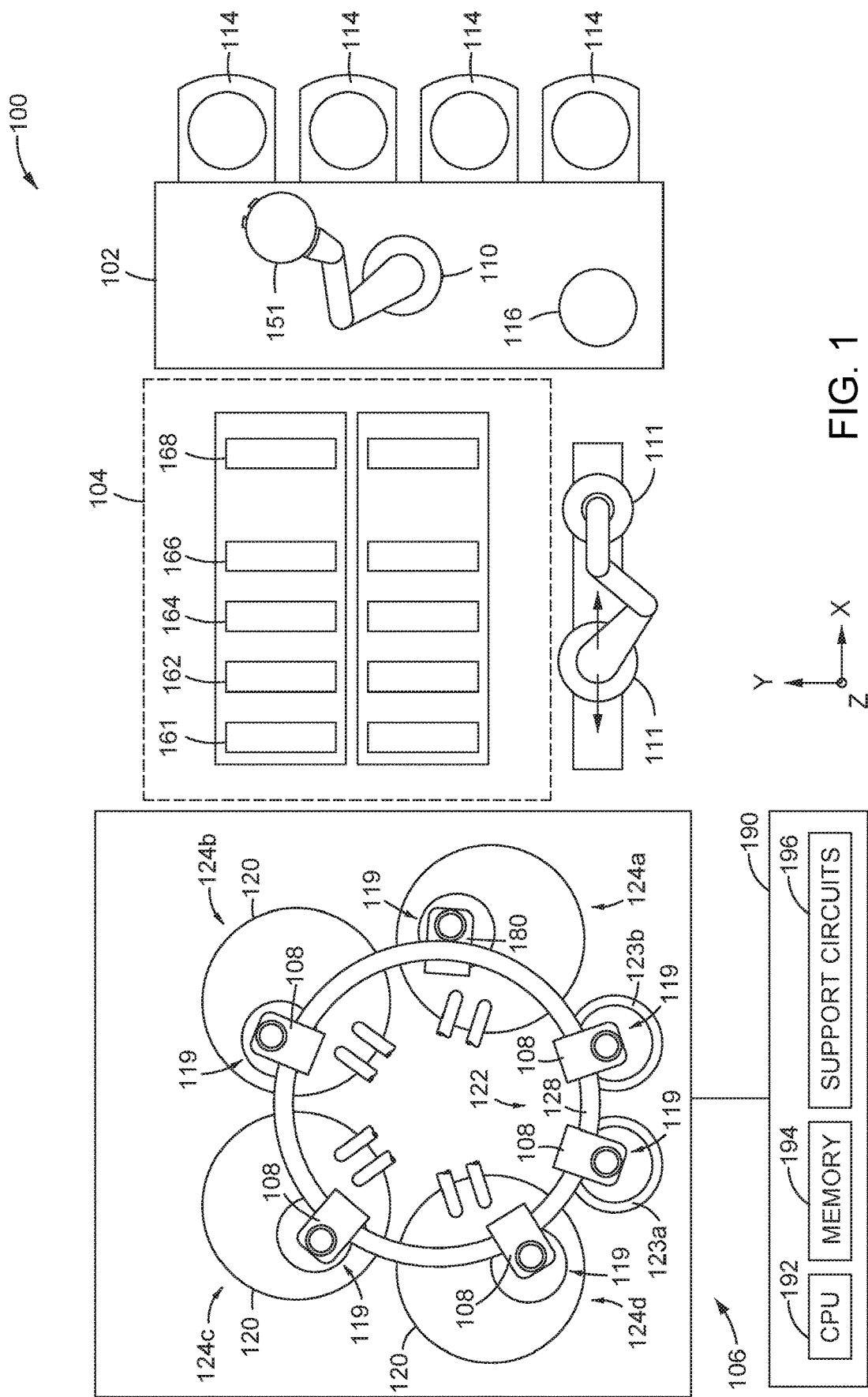
FIG. 1 illustrates a schematic top view of a chemical mechanical polishing system, according to one or more embodiments.

To facilitate understanding, identical reference numerals have been used, where possible, to designate identical elements that are common to the figures. It is contemplated that elements disclosed in one embodiment may be beneficially utilized in other embodiments without specific recitation thereof with respect thereto.

DETAILED DESCRIPTION

Embodiments of the present disclosure generally relate to an improved cleaning system and method for removing particles from a processed wafer. In various instances, wafer cleaning is performed by chemical buffing and/or brush scrubbing. However, in such instances, the wafer may suffer from particle reattachment after either of the chemical buffing and/or brush scrubbing processes. Even though the particles that reattach to the wafer may be loosely attached to the wafer and be relatively small in size (e.g., about 50 nm or less), the particles may lead to the wafer being unable to be made into front end logic and advanced memory devices due to the creation of defects with the devices formed on the wafer. As such, the yield for the processed wafers will be negatively impacted. Thus, there is a need for a new cleaning method that is able to remove the reattached particles. For example, the following description describes a system and method for a non-contact cleaning method that may utilized after a chemical buffing and/or brush scrubbing cleaning process to remove any remaining particles on the wafer.

FIG. 1 is a top plan view illustrating one embodiment of a chemical mechanical planarization ("CMP") system 100. The CMP system 100 includes a factory interface 102, a cleaner 104, and a polishing module 106. A robot 111 is provided to transfer wafers 151 between the factory interface 102 and the polishing module 106. The robot 111 may also be configured to transfer wafers between the polishing module 106 and the cleaner 104. The factory interface 102 includes a robot 110 which is configured to transfer wafers (e.g., the wafer 151) between one or more cassettes 114 and one or more transfer platforms 116. The robot 110 additionally is configured to receive wafers from the cleaner 104 and return the clean polished wafers to the storage cassettes 114.

The polishing system 100 includes a polishing module 106 that at least partially supports and houses a plurality of polishing stations 124a-124d and load cups 123a-123b. Each polishing station 124 is adapted to polish a substrate that is retained in a carrier head configured to carry a wafer 151 within a carrier head assembly that translates along an overhead track 128. The carrier head assembly 119 is moved along the track 128 by a carrier motor attached to the carriage 108. The carriage 108 generally includes structural elements that that are able to guide and facilitate the control of the position of the carrier head assembly 119 along the overhead track 128. Further, the Polishing module 106 also includes a loading station 122 for loading and unloading substrates from the carrier heads. Each polishing station 124 includes a platen 120 that is rotated during wafer polishing. Additionally, each polishing station 124 utilizes pads and polishing liquids to polish a wafer (e.g., the wafer 151).

A controller 190, such as a programmable computer, is connected to elements of the polishing module 106 is configured to operate the elements of the polishing module 106. For example, the controller 190 may control the loading, unloading and polishing of wafers 151 by the polishing module 106.

The controller 190 can include a central processing unit (CPU) 192, a memory 194, and support circuits 196, e.g., input/output circuitry, power supplies, clock circuits, cache, and the like. The memory 194 is connected to the CPU 192. The memory is a non-transitory computable readable medium, and can be one or more readily available memory such as random access memory (RAM), read only memory (ROM), floppy disk, hard disk, or other form of digital storage. In addition, although illustrated as a single computer, the controller 190 could be a distributed system, e.g., including multiple independently operating processors and memories. This architecture is adaptable to various polishing situations based on programming of the controller 190 to control the order and timing that the carrier heads are positioned at the polishing stations.

The polishing system 100 further includes at least one of megasonics cleaning modules 161, pre-clean modules 162, brush box cleaning modules 164, final clean modules 166, and a drying tank 168. Further, FIG. 1 may include an input shuttle module. In one embodiment, each of the megasonics cleaning modules 161, pre-clean modules 162, brush box cleaning modules 164, final clean modules 166, and drying tank 168 include a pair of processing chambers that are positioned side-by-side in the Y-direction. The two final clean modules 166 each include a cleaning module as is described in more detail herein. As is illustrated, the cleaning modules 166 may be used as a last cleaning step, e.g., a final clean module. In other embodiments, one or more cleaning modules may be positioned between the cleaning modules 166 and the drying tank 168. Further, in one or more embodiments, one or more of the modules may be omitted.

Figure 2A:
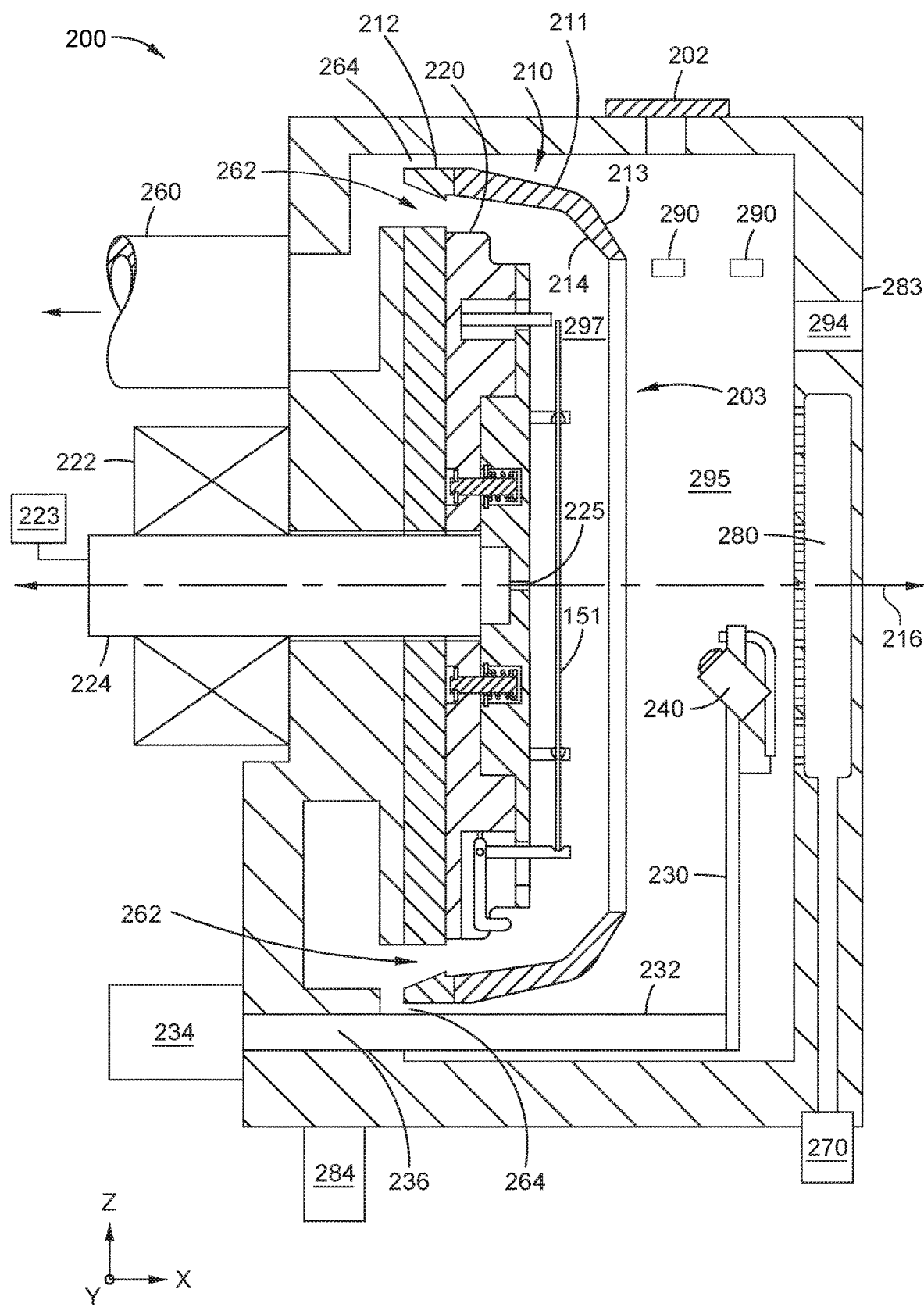
FIG. 2A is a schematic cross sectional side view of a cleaning module, according to one or more embodiments.

FIG. 2A is a schematic illustration of a cross sectional view of a non-contact cleaning module 200, according to one or more embodiments. The cleaning module 200 may receive a wafer, e.g., wafer 151, to be cleaned after the wafer has been cleaned within one or more of the megasonics cleaning modules 161, the pre-clean modules 162, the brush box cleaning modules 164, and before the wafer is placed in a corresponding Marangoni drying tank (e.g., the drying tank 168). Further, in various embodiments, the cleaning module 200 may be placed anywhere within the wafer cleaning cycle and/or the edge/bevel cleaning process. The cleaning module 200 may be utilized to remove contamination from the wafer that if not removed, may lead to a corresponding wafer not meeting quality standards and being discarded.

The cleaning module 200 includes a wafer gripping device 203, sweep arm 230, nozzle mechanism 240, plenum 280, exhaust 260, spray bar 290, drain 284, and air intake 270. The cleaning module 200 may further include a sensing device 294.

The wafer gripping device 203 is configured to support (e.g., hold) the wafer 151 in a vertical orientation. For example, the wafer gripping device 203 is configured to support the wafer 151 in a vertical orientation that is perpendicular to the rotational axis 216. The wafer gripping device includes a catch cup 210 and a gripper assembly 220. The catch cup 210 may include a first catch cup 211 and a second catch cup 212. The first catch cup 211 may be coupled to the second catch cup 212. For example, the first catch cup 211 may be coupled to the second catch cup 212 via one or more bolts. One or more of the first catch cup 211 and the second catch cup 212 may include one or more threaded portions configured to receive a threaded bolt. Alternatively, the catch cup 210 includes a single catch cup. For example, the catch cup 210 may be formed from single, continuous piece of material.

The catch cup 210 includes a wall 213 having an annular inner surface 214. The annular inner surface 214 defines a processing volume 297 within the wafer gripping device 203. The annular inner surface 214 has an angled portion that is symmetric about a central axis of the wafer gripping device 203. For example, the wafer 151 may be cleaned within the processing volume 297. Further, the annular inner surface 214 has an angled portion that is symmetric about a rotational axis 216.

The gripper assembly 220 holds the wafer 151 while cleaning fluids are applied to the wafer 151 for cleaning. The gripper assembly 220 is described with further detail with regard to FIG. 3A and corresponding description.

Cleaning fluids may be applied to the front side of the wafer by nozzle mechanism 240 and to the backside of the wafer via an opening 225 formed in the shaft 224, which is coupled to a fluid source 223, while the gripper assembly 220 and the catch cup 210 are rotated. The shaft 224 may include one or more tubes configured to deliver cleaning fluids to the wafer 151.

Figure 3A:
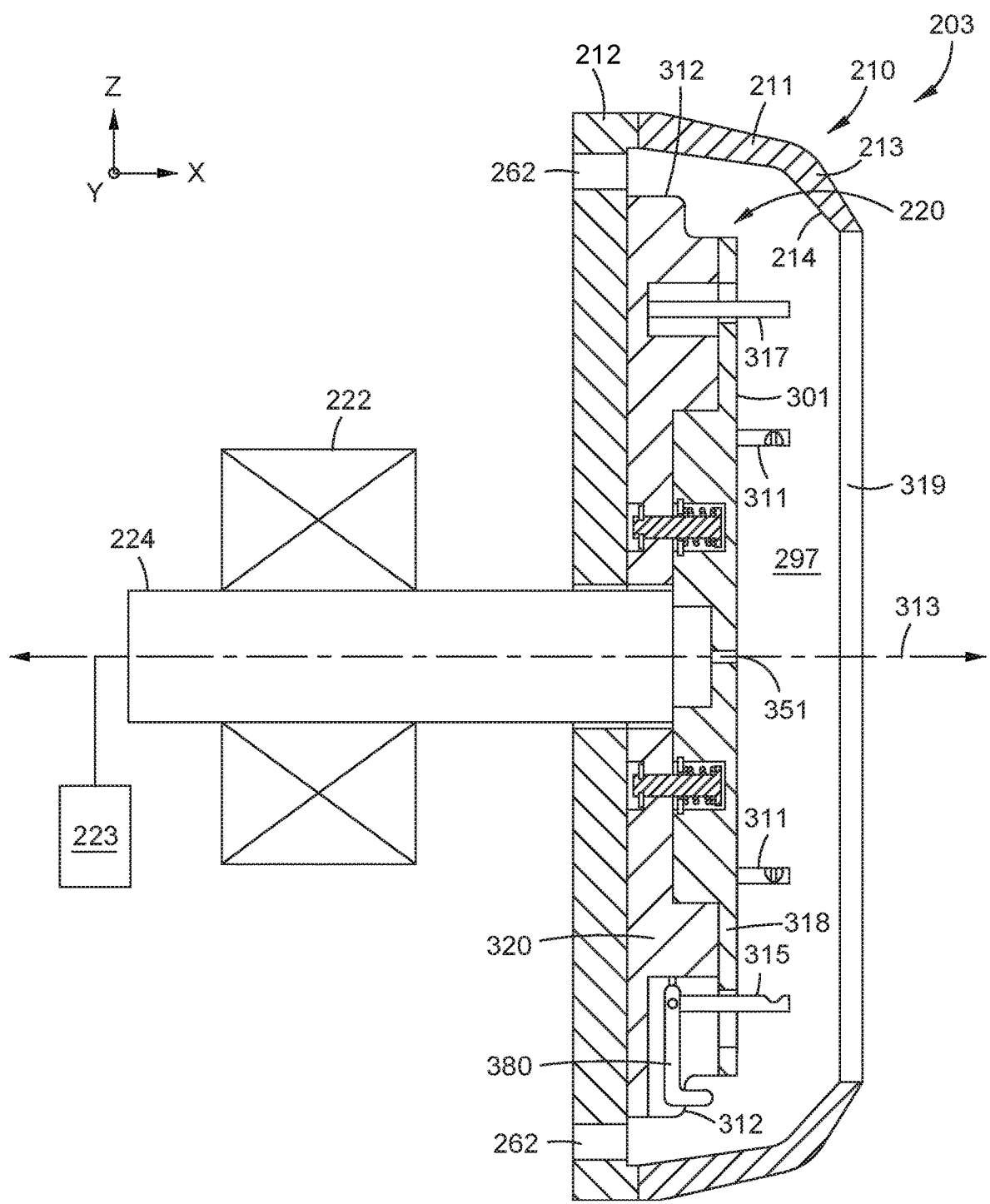
FIGS. 3A and 3B are a schematic cross sectional side views of a wafer gripping device, according to one or more embodiments.

The drive motor 222 may be coupled to the gripper assembly 220 via shaft 224. The drive motor 222 rotates the gripper assembly 220 and the catch cup 210 about rotational axis 216. Further, the drive motor 222 may impart horizontal motion to the gripper assembly 220 along the rotational axis 216. The drive motor 222 may include a first motor configured to control rotation of the gripper assembly 220 and the catch cup 210, and a second motor configured to control horizontal movement of the gripper assembly 220. The first motor may be referred to as a rotation motor, and the second motor may be referred to as a linear actuator. Further, the second motor may be one of a hydraulic, pneumatic, electromechanical, and a magnetic motor. The horizontal movement is generally a movement in an axial direction or movement in a direction parallel to the rotational axis 216. In one embodiment, horizontal movement corresponds to motion in the X direction as indicated by FIG. 3A. Further, horizontal movement of the gripper assembly 220 may be independent of movement of the catch cup 210. Additionally, the gripper assembly 220 and the catch cup 210 may be configured to be rotated together (e.g., simultaneously).

The sweep arm drive motor 234 may be coupled to sweep arm shaft and be configured to move the sweep arm 230 in an arcuate path that is parallel to a surface of the wafer 151, as is discussed further below. The sweep arm 230 may include a one or more tubes to deliver fluids to the nozzle mechanism 240.

The lid 202 may cover an opening formed in the wall (e.g., enclosure wall) 283 and provide access to the interior volume 295 of the cleaning module 200 for inserting and removing the wafer 151 from the cleaning module 200. When the lid 202 is a closed position, the interior volume 295 of the cleaning module 200 may be referred to as an isolated environment. For example, when the lid 202 is closed, the interior volume 295 of the cleaning module 200 is isolated from the external environment, such that fumes and liquids generated and/or used during cleaning of the wafer 151 do not escape from the cleaning module 200 during the cleaning process. Any fumes and cleaning liquids used and/or generated during the cleaning process are removed from the cleaning module 200 in a controlled manner via the exhaust 260 and/or the drain 284.

The spray bars 290 may apply a pre-treatment fluid to the wafer 151 as the wafer 151 is inserted into the cleaning module 200 and/or rinse the wafer 151 with a rinsing fluid as it is removed from the cleaning module 200. In one embodiment, the spray bars 290 may be utilized to apply fluids to the wafer 151 during when the wafer 151 is in either a loading or unloading position. Pre-treating and/or rinsing the wafer 151 may aid in removing unwanted particles from the surface the wafer 151. For example, rinsing the wafer 151 while it is removed from the cleaning module 200 aids in removing loosened particles from the surface of the wafer 151 and further aids in preventing removed particles from reattaching to the surface of the wafer 151.

The drain 284 may be utilized to remove excess moisture from the cleaning module 200. In one embodiment, the drain 284 removes excess cleaning fluids from the cleaning module 200 during a cleaning process.

Air may be provided to plenum 280 by air intake 270, and exhausted from the cleaning module 200 by exhaust 260. The air intake 270 and the plenum 280 are positioned at the front of the cleaning module 200 and the exhaust 260 is positioned at the back of the cleaning module 200. Further, the plenum 280 and exhaust 260 may be configured to control the flow of air within the cleaning module 200 to prevent particles from reattaching to the surface of the wafer 151. The position of the exhaust 260 and the air intake 270 may be reversed, such that the exhaust 260 is positioned at the front of the cleaning module 200 and the air intake 270 is positioned at the back of the cleaning module 200.

An interior volume 295 of the cleaning module 200 may be defined as being between the catch cup 210 and the wall (e.g., enclosure wall) 283. Wafers (e.g., the wafer 151) may be inserted into the interior volume 295 when being loaded into the cleaning module 200 and removed from the interior volume 295 when being removed from the cleaning module 200.

The sensing device 294 may detect the wafer 151 within the cleaning module 200. For example, the sensing device 294 may detect the wafer 151 within the interior volume 295. Further, the sensing device 294 may detect the wafer 151, while the wafer 151 is being held by the gripper assembly 220. The sensing device 294 may detect when the wafer 151 has been properly or improperly loaded into the gripper assembly 220. Further, the sensing device 294 may detect when the wafer 151 has been dropped or fallen out of the gripper assembly 220. The sensing device 294 may further determine when the wafer 151 has been inserted into the cleaning module 200 and removed from the cleaning module 200.

In one or more embodiments, a controller 190 may control the functionality of the cleaning module 200. For example, the controller 190 may control the functionality of at least the gripper assembly 220, the spray bars 290, the sweep arm 230, nozzle mechanism 240, the exhaust 260, and/or the sensing device 294.

FIG. 2B illustrates an external view of two cleaning modules, e.g., cleaning module 200 and 201. In some embodiments, the cleaning module 201 includes the same components as the cleaning module 200, as is shown in FIGS. 2A-2B.

A cleaner (e.g., the cleaner 104) may include one or more cleaning modules (e.g., one or more of the cleaning modules 200 and 201). For example, the cleaner 104 may include the cleaning module 200 and the cleaning module 201 may be omitted. Alternatively, the cleaner 104 may include both of the cleaning modules 200 and 201. Further, the cleaner 104 may include more than two cleaning modules.

The cleaning modules 200 and 201 may include one or more inlet connections 292. The inlet connections 292 provide a path for the cleaning fluids to be provided within cleaning modules 200 and 201 during a cleaning process. The cleaning fluids may be provided to the nozzle mechanism 240, tubes on the sweep arm alongside the nozzle mechanism 240, the fluid source 223, and/or the spray bars 290. Further, cleaning modules 200 and 201 may include power cable connections 293 configured to couple to power cables external to the cleaning modules 200 and 201.

FIG. 2B additionally illustrates lid 202 of cleaning module 200 and lid 204 of cleaning module 201. During a wafer loading process, lids 202 and 204 are opened such that a wafer (e.g., wafer 151) may be inserted into each of the respective cleaning modules 200, 201. Further, during a wafer extraction process, lids 202 and 204 are opened such that a wafer (e.g., wafer 151) may be extracted from each of the respective cleaning modules 200, 201. In one or more embodiment, during the cleaning cycle the lids 202 and 204 are closed, sealing cleaning modules 200 and 201.

In the embodiment of FIG. 2B, the cleaning modules 200 and 201 are positioned such that a wafer 151 may be in a vertical orientation during the cleaning process. However, in other embodiments, other orientations may be used. Further, each of the cleaning modules 200 and 201 may be configured to operate as a single module as dictated by the cleaner (104) architecture.

FIG. 3A illustrates an example embodiment of the wafer gripping device 203. As illustrated the wafer gripping device 203 includes the gripper assembly 220 and the catch cup 210, which are illustrated in FIG. 2A. The gripper assembly 220 is positioned within the processing volume 297 during at least the cleaning cycle.

The gripper assembly 220 includes first plate assembly 318, second plate assembly 320, loading pins 311 and gripping pins 315. The gripper assembly 220 is coupled to the shaft 224 which may be driven by the drive motor 222 to rotate the first plate assembly 318 and the second plate assembly 320 during a cleaning cycle of the cleaning process. Further, the shaft 224 may be driven to move the first and second plate assemblies 318, 320 in and out of a loading position, an unloading position, a rinse position and a cleaning position. Further, cleaning fluids may flow through the shaft 224 such that they are applied to the backside of the wafer 151 via aperture 351 in the first plate assembly 318 during the cleaning process. In one embodiment, the shaft 224 may be a spline shaft that allows the gripper assembly 220 to be rotated while the shaft 224 is translated in the +X and −X directions.

The gripping pins 315 may grip, or hold, the wafer 151 during the cleaning process. The gripping pins 315 may include a shaped area configured to receive the wafer 151. For example, the gripping pins 315 may include a notched area shaped to receive an edge of the wafer 151. Further, the gripping pins 315 may be housed within the second plate assembly 320. Additionally, or alternatively, the gripping pins 315 may be coupled to the second plate assembly 320. The gripping pins 315 may be disposed at about 120° from each other. Alternatively, the gripping pins 315 may be oriented less than 120° from each other or greater than 120° from each other. Further, the total number of gripping pins 315 may be one or more. Alternatively, the total number of gripping pins 315 is two or more. Further, the total number of gripping pins 315 is three or more. The gripping pins 315 may pass through openings within the first plate assembly 318, such the gripping pins 315 are able to grip, or hold, the wafer 151 during a cleaning cycle. The gripping pins 315 may have minimal contact with the wafer 151 along the edge of the wafer 151 such that the gripping pins 315 do not impeded with the cleaning process of the wafer 151.

The loading pins 311 may grip, or hold, the wafer 151 during the loading and/or unloading process. Further, the loading pins 311 are coupled to the first plate assembly 318. As the gripper assembly 220 is moved between the cleaning position and a loading or unloading position, the loading pins 311 are moved together with the first plate assembly 318. The loading pins 311 may include a shaped area configured to receive the wafer 151. For example, the loading pins 311 may include a notched area shaped to receive an edge of the wafer 151. The loading pins 311 may be configured to have minimal contact with the wafer 151 along the edge of the wafer 151 such that the loading pins 311 do not impeded with the cleaning process of the wafer 151. The loading pins 311 may be disposed at about 120° from each other. Alternatively, the loading pins 311 may be oriented less than 120° from each other or greater than 120° from each other. Further, the total number of loading pins 311 may be one or more, two or more, or three or more.

The number of gripping pins 315 and the loading pins 311 may be the same. Alternatively, the number of gripping pins 315 may exceed the number of the loading pins 311. Further, the number of gripping pins 315 may be less than the number of the loading pins 311.

The first plate assembly 318 and the loading pins 311 may be utilized during a wafer loading process. Further, the second plate assembly 320 and gripping pins 315 are positioned such there is no interference with the wafer during the loading process. For example, the first plate assembly 318 may move relative to the second plate assembly 320, positioning the first plate assembly 318 outside the first catch cup 211 and the gripping pins 315 in a loading position. Further, a distance between the gripping pins 315 and a center of the gripper assembly 220 is increased. Additionally, the gripping pins 315 may be positioned behind the loading pins 311 providing a clear path for the wafer 151 to be vertical loaded and/or unloaded onto the loading pins 311.

The wall 213 of the catch cup 210 is shaped such that it interacts with second plate assembly 320 and/or one or more of the gripping pins 315. The wall 213 may be part of the catch cup 210 as is described above, or the annular wall may be part of the first catch cup 211. The wall 213 includes at least one angled portion such that it may interact with the feature 312 of the second plate assembly 320. Further, the wall 213 aids in guiding moisture away from the wafer 151 and into the drain 284, reducing particle reattachment on the wafer 151 during the cleaning process. For example, when the gripper assembly 220 is in the wafer loading position, the features 312 interact with the wall 213 to allow the first plate assembly 318 to move relative the second plate assembly 320, as will be described in greater detail in the following.

Further, the catch cup 210 may comprise an opening 319. The diameter of the opening 319 may be large enough to allow the first plate assembly 318 to pass through, but not large enough to allow the second plate assembly 320 to pass through. For example, the diameter of the opening 319 may be greater than the first plate assembly 318 and less than the second plate assembly 320.

The catch cup 210 may include drain holes 262 positioned in an array along the edge of the catch cup 210 such that moisture flows into the drain 284 while the wafer 151, the gripper assembly 220, and the catch cup 210, are rotated by the drive motor 222. Further, the second catch cup 212 may include the drain holes 262. The moisture flows through drain holes 370 into drain 284 (FIG. 2A) where it is removed from the cleaning module 200.

Figure 3B:
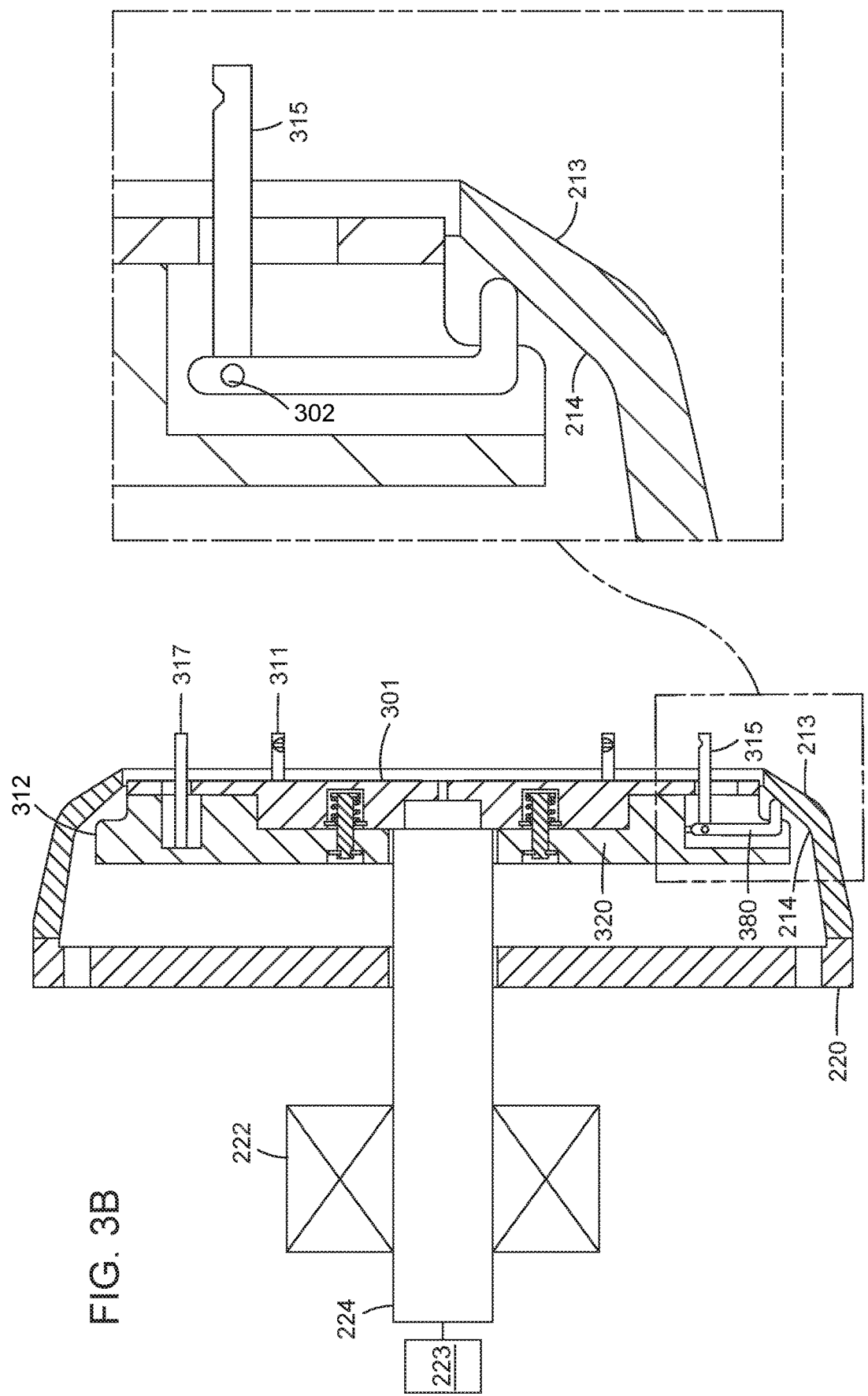
Figure 3C:
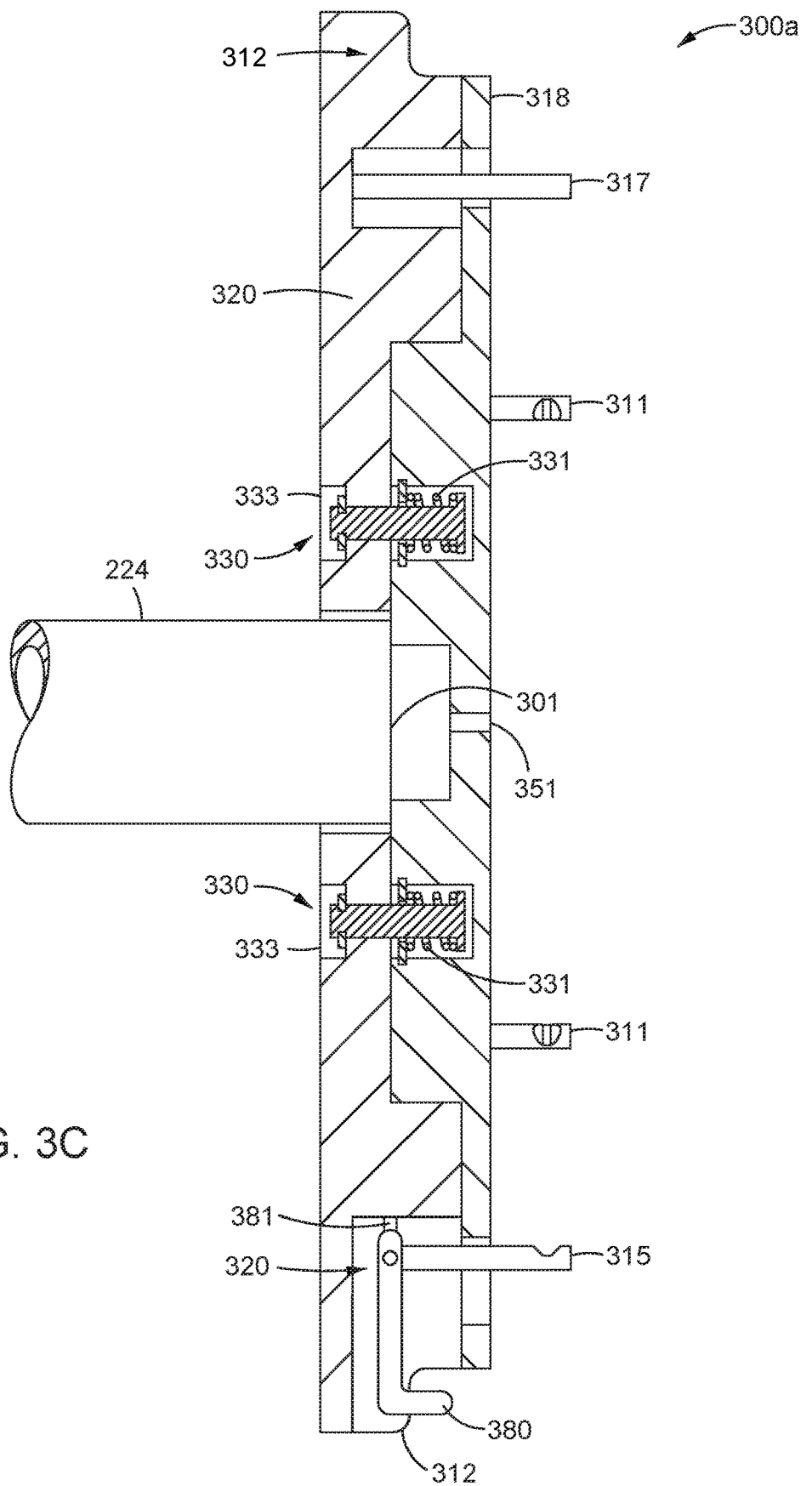
FIGS. 3C, 3D, and 3E illustrate various views of a gripper assembly, according to one or more embodiments.
Figure 3D:
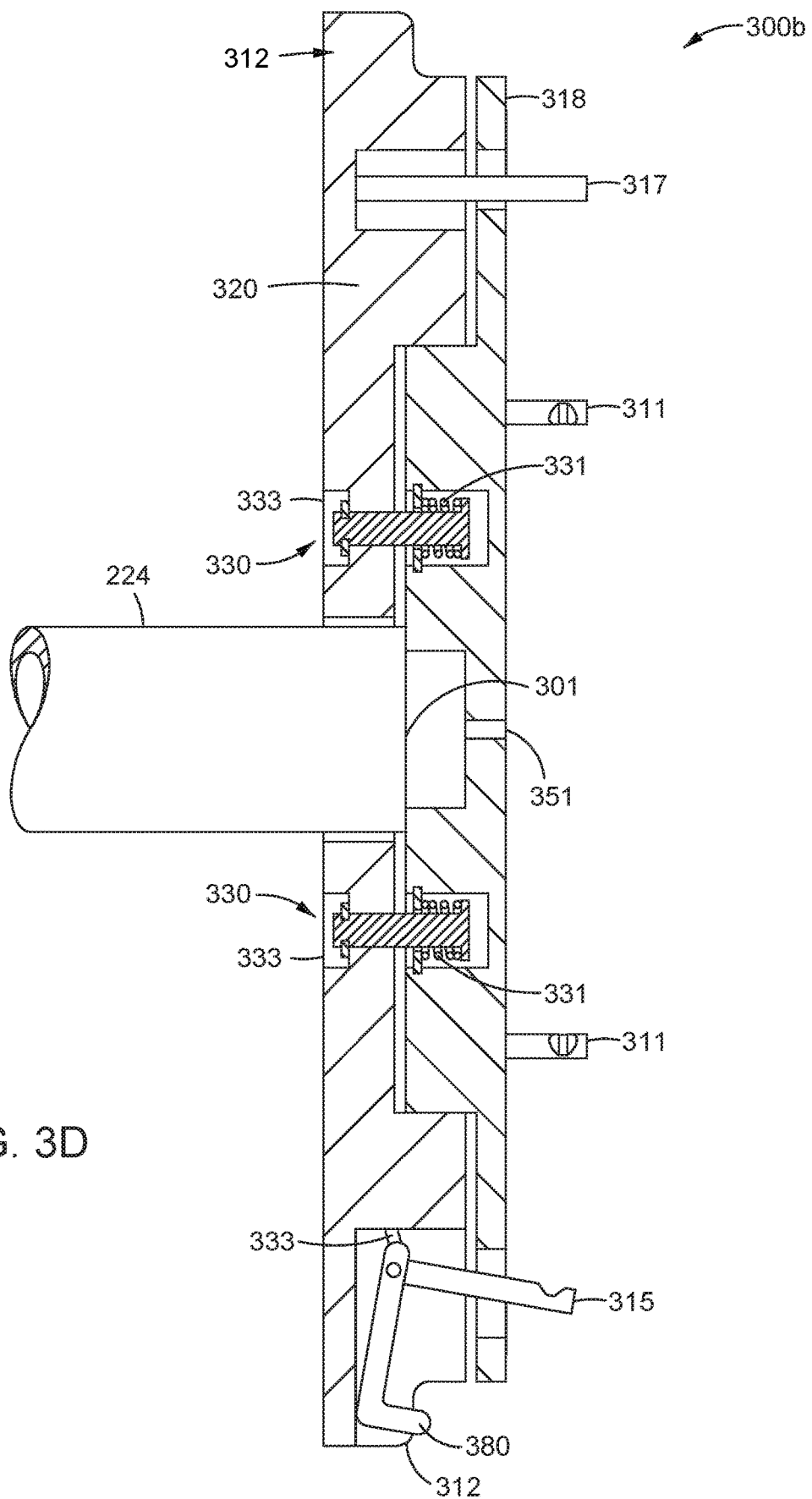

As illustrated in FIG. 3A, the gripper assembly 220 includes a first plate assembly 318 and a second plate assembly 320 that are configured to move relative to one another to aid in receiving the wafer 151 and placing the wafer 151 in a cleaning position. Specifically, FIGS. 3C and 3D illustrates an embodiment of the gripper assembly 220 in a retracted position (e.g., a cleaning position) 300a and an extended position 300b, respectively. The gripper assembly 220 may be positioned in the retracted position 300a during a cleaning process. Further, the gripper assembly 220 may be positioned in the extended position (e.g., a loading position) 300b during a wafer loading process and/or a wafer removal (unloading) process. Further, the extended position 300b may correspond to a loading position of the gripper assembly 220 within the cleaning module 200. The loading/unloading position may also serve as the rinsing position for the wafer 151. For example, when positioned in the loading/unloading position for rinsing, deionized water and/or other cleaning chemistries may be delivered from the top spray bars 290 onto the wafer 151. Additionally, when the gripper assembly 220 is in the loading position, the gripper assembly 220 is positioned a distance in the X-direction from where the gripper assembly 220 is positioned in the cleaning position. In one embodiment, a coupling surface 301 of the first plate assembly 318 is coupled to and driven by shaft 224.

One or more spring mechanisms 330 may couple the first plate assembly 318 to the second plate assembly 320. The spring mechanisms 330 may include a spring 331 and a coupling member 333. The spring mechanisms 330 allow the first plate assembly 318 to move relative to the second plate assembly 320 when features (or elements) 312 contact the first catch cup 211. For example, the second plate assembly 320 includes features 312 that are configured to interact with the wall 213, as the gripper assembly 220 is moved in the positive X direction (e.g., horizontally toward first catch cup 211). In one embodiment, each of the spring mechanisms 330 may include one or more springs 331 that move over or in parallel to the coupling member 333.

The gripping pins 315 may be configured to move relative to at least one other pin. For example, the gripping pins 315 may include one or more elements that at move the gripping pins 315 away from one or more of the other pins. The gripping pins 315 may be are configured to grip a wafer (e.g., wafer 151) during the cleaning process. Further, the loading pins 311 may be configured to grip or hold the wafer 151 during a loading and unloading process. In other embodiments, the gripping pins 315 may be moved to hold the wafer against the loading pins.

The gripper assembly 220 may also include guide pin 317 that is configured to restrict angular motion of the second plate assembly 320 relative to the first plate assembly 318.

In one or more embodiments, each gripping pin 315 may be coupled to an element 380 that is configured to contact the housing of the first catch cup 211 which imparts a translation motion onto one or more of the gripping pins 315. For example, in response to the element 380 contacting the first catch cup 211, when the gripper assembly 220 is moved in the +X direction, a gripping pin 315 pivots about axis 302 and is moved toward an outer edge of the gripper assembly 220. FIG. 3B illustrates an example embodiment, where the elements 380 have just contacted the first catch cup 211 and are in a closed position. In one embodiment, as the gripper assembly 220 is moved in the +X direction, the elements 380 contact the first catch cup 211 and pivot about axis 302. In response, a translation motion is imparted onto the gripping pins 315 coupled to the elements 380. In one embodiment, the elements 380 continue to pivot until movement of the gripper assembly 220 in the +X direction is stopped. In one embodiment, the elements 380 and gripping pins 315 are positioned in an open position after movement of gripper assembly 220 in the +X direction has stopped.

Further, the element 380 may be coupled to a spring element 381. The spring element 381 may further return the element 380 to a starting position, moving the gripping pin 315 to a gripping position in response to the element 380 no longer contacting the housing of the first catch cup 211. The spring element 381 may load the element 380, such that the element 380 returns to a starting position when the element 380 is no longer contacting the housing of the first catch cup 211. Further, the spring element 381 may be a leaf spring or any other spring design.

The loading pins 311 and the gripping pins 315 may be configured to hold the wafer 151 such that the wafer 151 does not contact the first plate assembly 318 of the gripper assembly 220. Further, the position of the wafer 151 relative to the first catch cup 211 may be adjustable during the cleaning cycle.

Figure 3E:
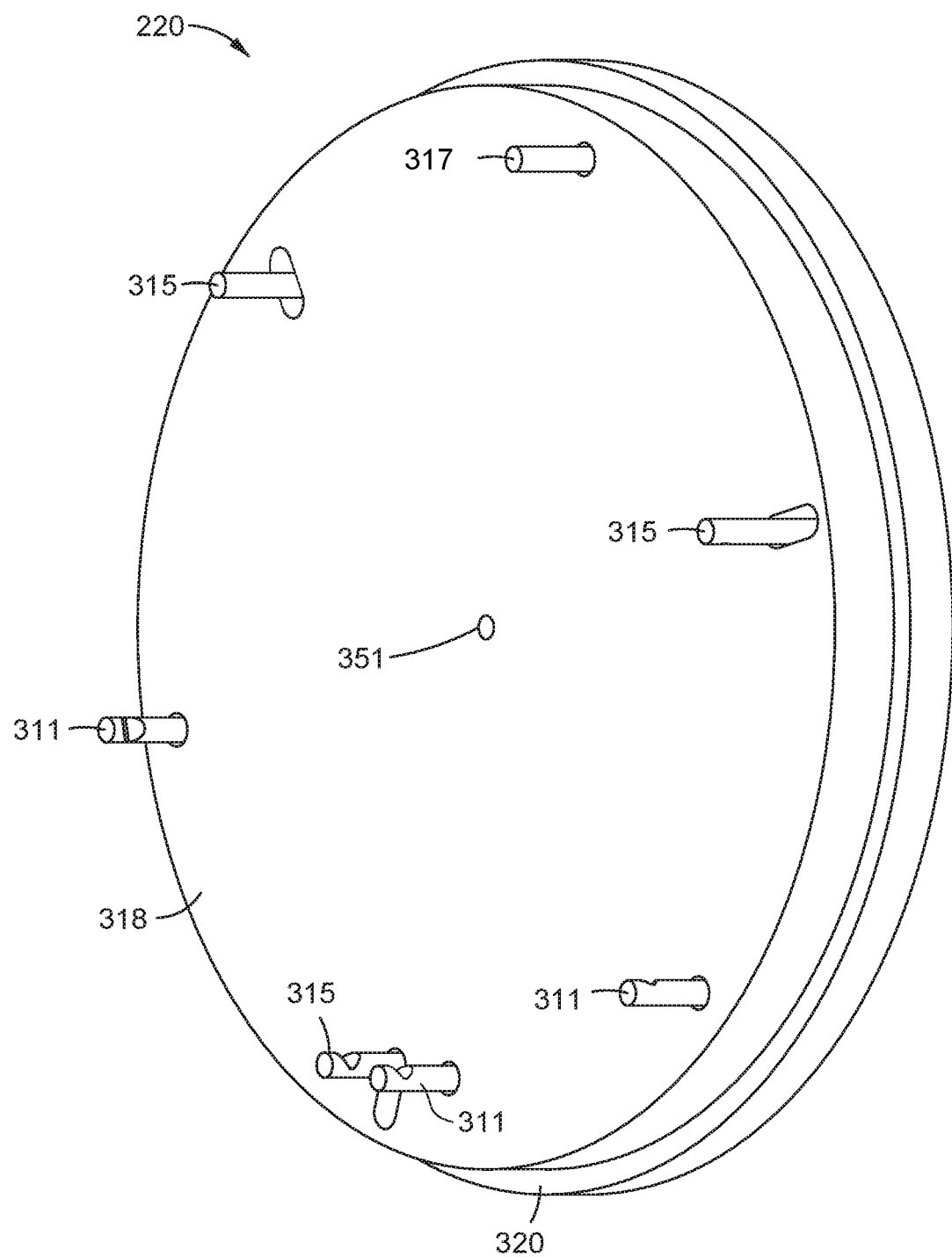
Figure 3F:
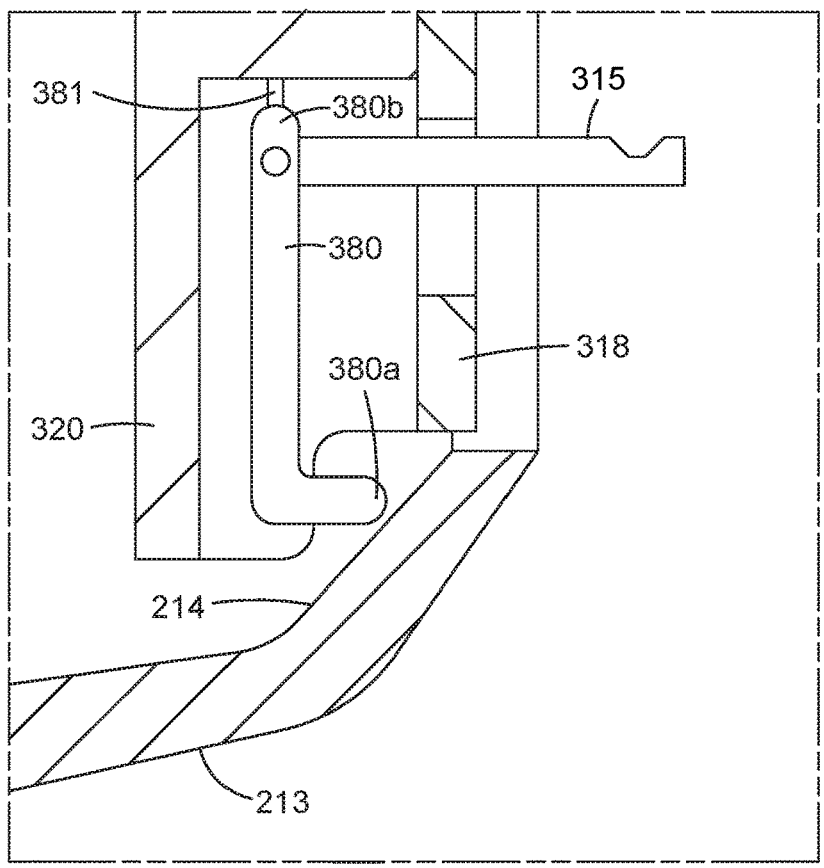
FIGS. 3F and 3G illustrate various views of a gripper assembly, according to one or more embodiments.
Figure 3G:
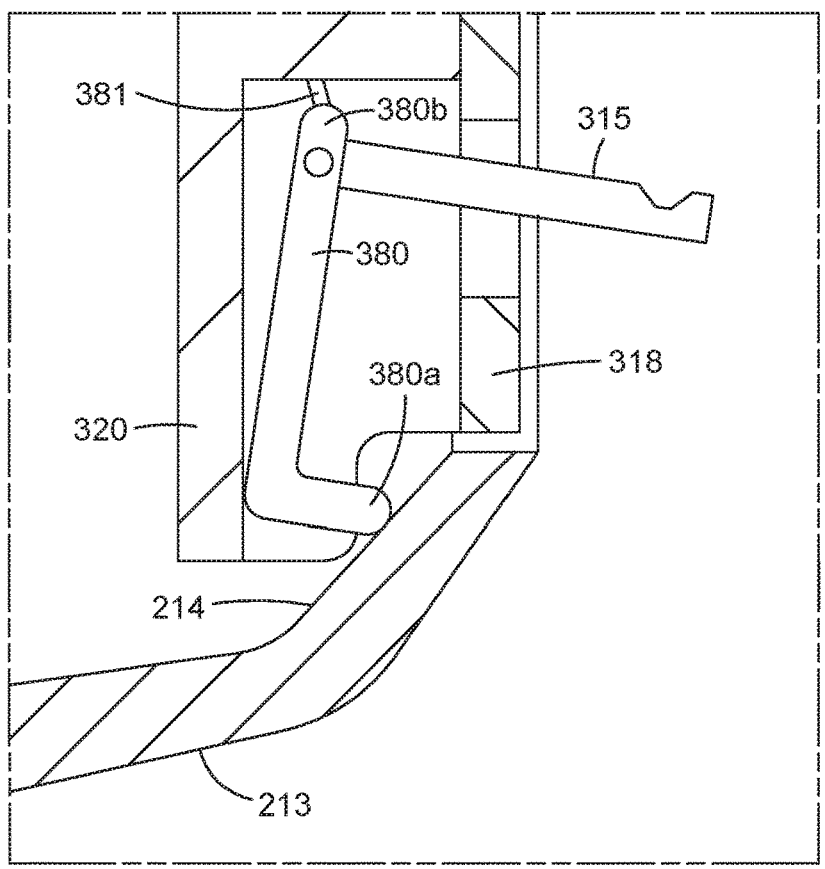

FIG. 3F illustrates an embodiment of the gripping pin 315 and the element 380 in a closed position, end 380a is not in contact with the first catch cup 211. FIG. 3G illustrates the element 380 and the gripping pin 315 in an open position. In the illustrated embodiment of FIG. 3G, the end 380a of the element 380 is in contact with the first catch cup 211. Further, the element 380 has been pivoted such that end 380b of the element 380 has been moved relative to end 380a. In one embodiment, end 380b has been rotated toward an upper surface of the second plate assembly 320. Additionally, the gripping pin 315 has also been moved, such that it has been tilted outward toward the first catch cup 211.

With further reference to FIG. 3C, the gripper assembly 220 further includes one or more apertures 351. In one or more embodiments, cleaning fluids may flow onto a backside of wafer 151 through the aperture(s) 351. The cleaning fluids may be a rinsing agent (e.g., DI water, Ozonated water) or a cleaning chemical. Further, the cleaning fluids may be provided via shaft 224 and then to the apertures 351.

FIG. 3E illustrates schematic partial plane view of the gripper assembly 220. The aperture(s) 351 flow chemicals onto the backside of the wafer 151. The one or more apertures 351 may be disposed in a substantially circular or linear pattern. Each of the apertures 351 may be substantially the same size such that the cleaning fluid flows evenly across the back surface of the wafer 151. Further, at least one aperture 351 may be of a different size than at least one other aperture.

Figure 4B:
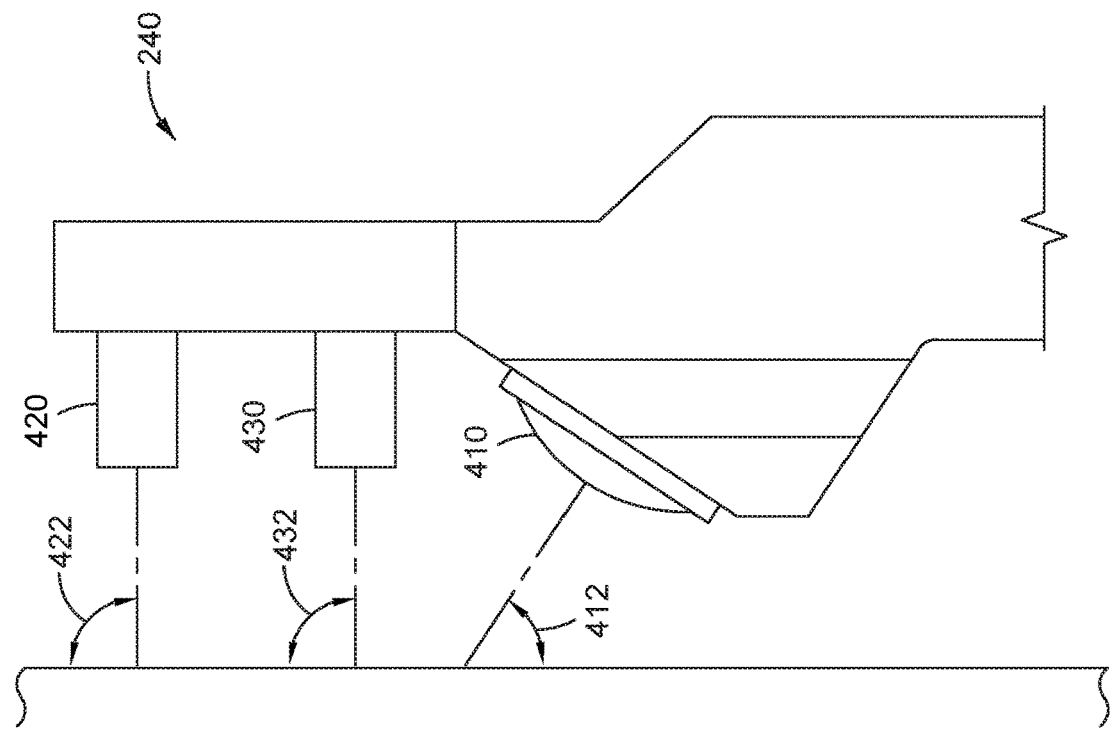
FIGS. 4A, 4B, and 5 illustrate various nozzle mechanisms, according to one or more embodiments.
Figure 4A:
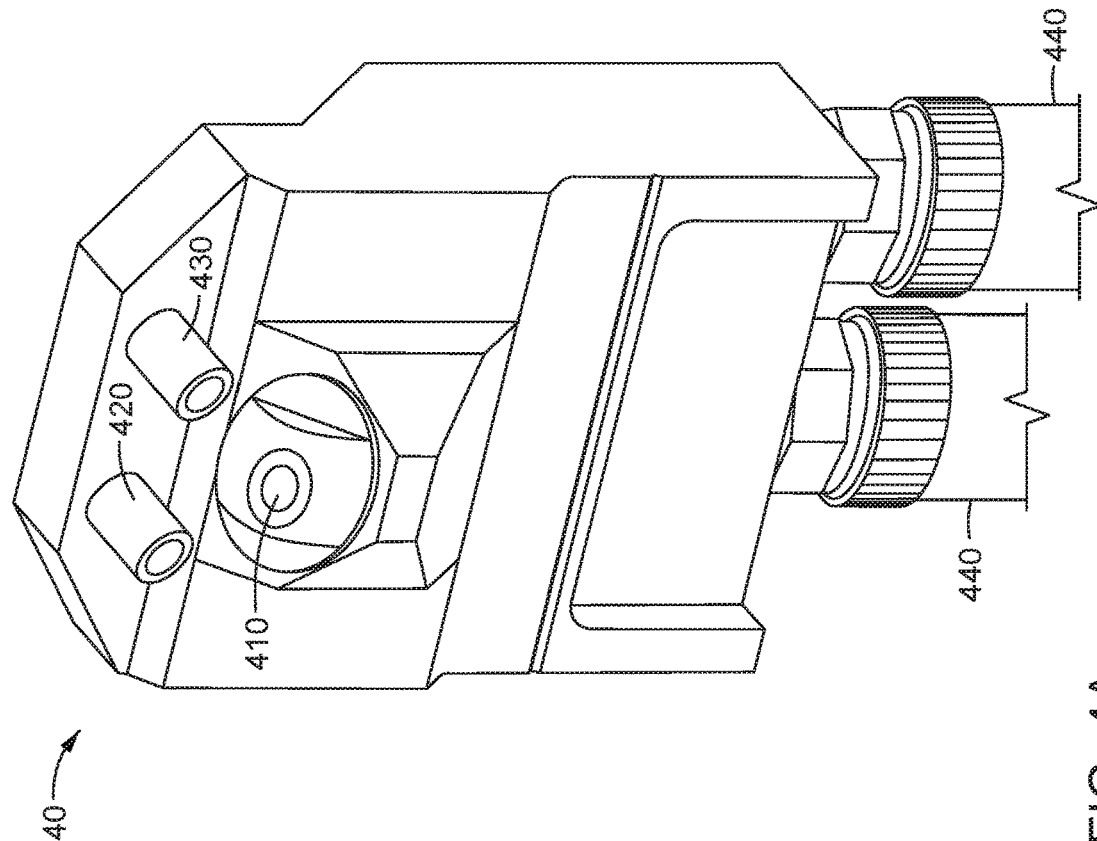

FIG. 4A is a bottom view of nozzle mechanism 240 that is attached to the sweep arm 230. As is illustrated the nozzle mechanism 240 includes a nozzle 410, a nozzle 420 and a nozzle 430. Alternatively, one or more of the nozzle 420 and the nozzle 430 may be omitted. Further, the nozzle mechanism 240 may include more than three nozzles. The nozzle 410 may be disposed at a first angle (e.g., angle 412 of FIG. 4B) relative to a surface of the wafer 151, the nozzle 420 may be disposed at a second angle (e.g., angle 422 of FIG. 4B) relative to the surface of the wafer 151, and the nozzle 430 may be disposed at a third angle (e.g., angle 432 of FIG. 4B) relative to the surface of the wafer 151 or the surface of the first plate assembly 318. The angle 412 may differ from at least one the angles 422 and 432. Further, the angles 422 and 432 may be substantially similar. In some configurations, the nozzle 410 may be disposed at an angle (e.g., angle 412) relative to a surface of a wafer that is less than the angles (e.g., 422 and 432) at which the nozzle 420 and the nozzle 430 are disposed relative to the surface of the wafer. In some configurations, the angle 412 may be about a 30° to about a 50° relative to a surface of the first plate assembly 318 or the wafer 151 and the angles 422 and 432 are at about 80° to about 100° relative to the surface of the wafer 151 or the surface of the first plate assembly 318. In one embodiment, the angle 412 is about 45° relative to the surface of the wafer 151 or the surface of the first plate assembly 318, and the angles 422 and 432 are about 90° (or perpendicular) relative to the surface of the wafer 151 the surface of the first plate assembly 318. Further, other angles may be utilized. Additionally, or alternatively, the angles 412, 422, and 432 may each be between about 80° and about 100°. Further, the location of each of the nozzles 410, 420, and/or 430 may be adjusted in a direction along the length of the sweep arm 230 to target specific radial positions on the wafer. Additionally, the angle and position for each nozzle may be selected such that the cleaning fluids output by each nozzle function together to remove any contaminates from the surface of the wafer 151.

The nozzle mechanism 240 may be configured to output cleaning media via the nozzles 410, 420 and 430 onto a first surface of the wafer 151. The cleaning media may include rinsing agents and cleaning chemicals. Further, the nozzle mechanism 240 is configured to output a first cleaning media via nozzle 410, a second cleaning media via nozzle 420 and a third cleaning media via nozzle 430. Additionally, one or more of the nozzles 410, 420, and 430 are configured to apply one or more rinsing agents.

The nozzle mechanism 240 may include one or more non-contact cleaning technologies. The nozzles 410, 420, and 430 may output a media that is any combination of liquid, gas, and particulate. Further, one or more of the nozzles 410, 420, and 430 may be a high energy nozzle configured to output a high energy media. The high energy media may be any combination of liquid, gas, and particulate. Further, the high energy media may be a high energy cleaning chemistry. One or more of the nozzles 410, 420, and 430 may be a megasonic nozzle, fluid jet nozzle, or a kinetic energy nozzle. For example, the nozzle 410 is one of megasonic nozzle, a jet nozzle, and a kinetic energy nozzle configured to deliver a mixture of gas and liquid. The megasonic nozzle includes one or more elements configured to alternatively apply compression and rarefraction to the cleaning fluid in an alternating fashion according to a sinusoidal or other pattern to generate a megasonic actuated fluid. For example, the megasonic nozzle may be configured to alternatively applying compression and rarefraction in a sinusoidal pattern at a rate of 950 kHz to generate the megasonic actuated fluid. Alternatively, other frequencies may be used.

The nozzle 420 is configured to apply a first chemical, and the nozzle 430 is configured to apply a rinsing agent. Further, when the nozzle 410 is a megasonic nozzle, the nozzle 420 is configured to apply a first chemical, and the nozzle 430 is configured to apply a second chemical. Alternatively, when the nozzle 410 is a megasonic nozzle, the nozzle 420 is configured to apply a first rinsing agent, and the nozzle 430 is configured to apply a second rinsing agent. Further, at least two of the nozzles are configured to apply the same rinsing agent or chemical.

The cleaning fluids may be provided to the nozzle mechanism 240 via fluid connections 440. The number of connections may be based on the number of nozzles within the nozzle mechanism and/or the number of different types of chemicals and/or rinsing agents utilized by the nozzle mechanism 240. For example, where the nozzle mechanism 240 employs three nozzles configured to output two different cleaning fluids, two connections 440 may be utilized. Further, the flow rate of the different cleaning chemistries and/or rinsing agents through different nozzles may be varied. For example, the flow rate of a cleaning chemistry or a rinsing agent from a first one of the nozzles 410, 420, and 430 may be different than the flow rate of a cleaning chemistry or a rinsing agent from a second one of the nozzles 410, 420, and 430. Alternatively, the flow rate of a cleaning chemistry or a rinsing agent from at least one of the nozzles 410, 420, and 430 may be varied during a cleaning process and/or a rinsing process.

While FIG. 4 illustrates three separate nozzles, in other embodiments, other numbers of nozzles may be utilized. For example, more than three nozzles may be utilized. Further, less than three nozzles may be utilized.

Figure 5:
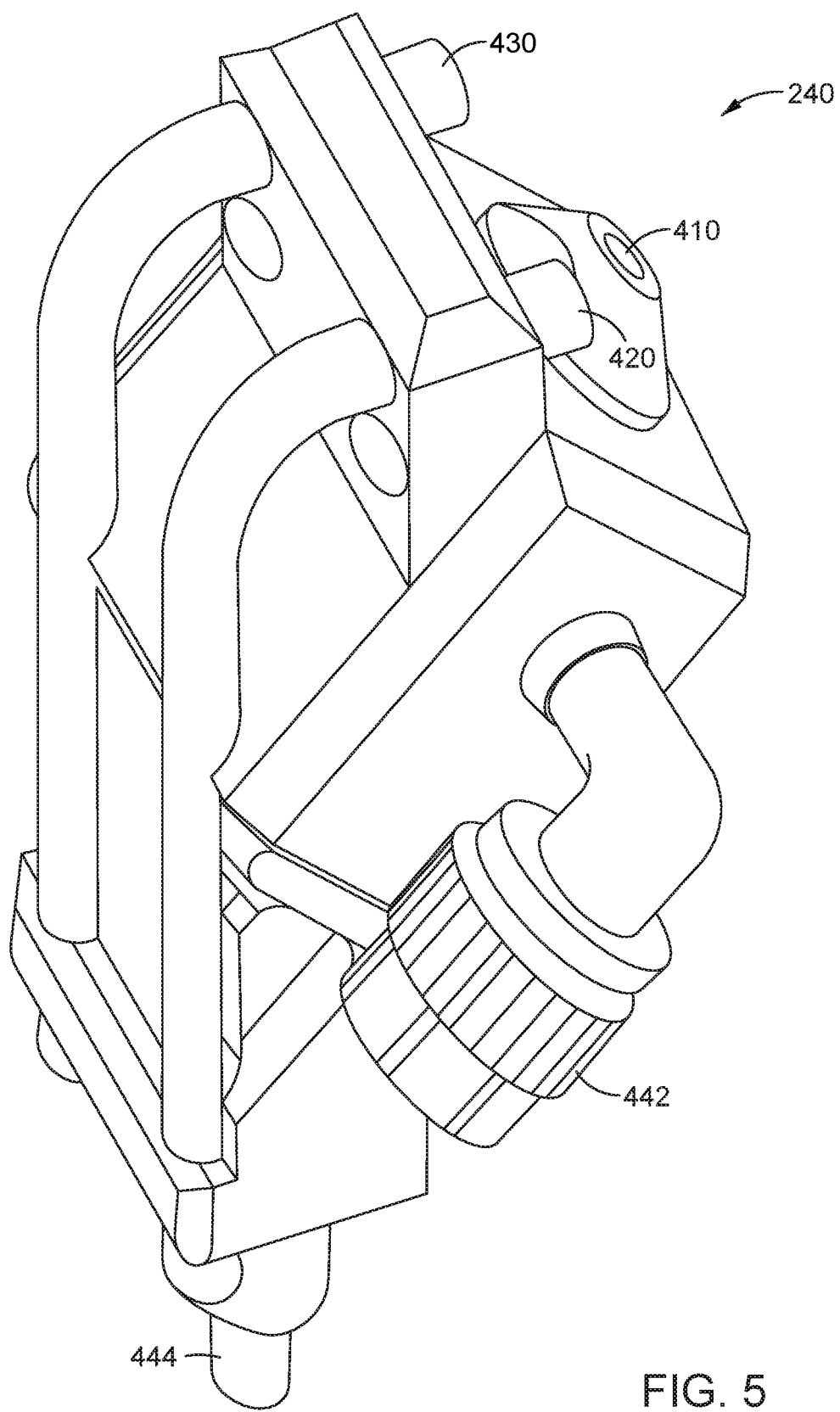

FIG. 5 illustrates an alternative embodiment of nozzle mechanism 240. As compared to the embodiment of FIG. 4, instead of having all of the connections 440 connecting to the common side of the nozzle mechanism 240, a first connection 442 connects to a first side of the nozzle mechanism 240 and a second connection 444 connects to a second side of the nozzle mechanism, where the first side is different from the second side.

Returning now to FIG. 2A, the sweep arm 230 is coupled to a sweep arm shaft 232 and a sweep arm drive motor 234. The sweep arm shaft 232 and the sweep arm drive motor 234 forms the sweep arm drive assembly 236. The sweep arm drive assembly 236 is configured to move the nozzle mechanism 240 over the surface of the wafer 151 during the cleaning process, such that the cleaning fluids output by the nozzle mechanism 240 are evenly distributed over the surface of the wafer 151. The sweep arm drive assembly 236 may also be configured to move the sweep arm 230 axially to set a distance between the nozzle mechanism 240 and the surface of the wafer 151.

Figure 6:
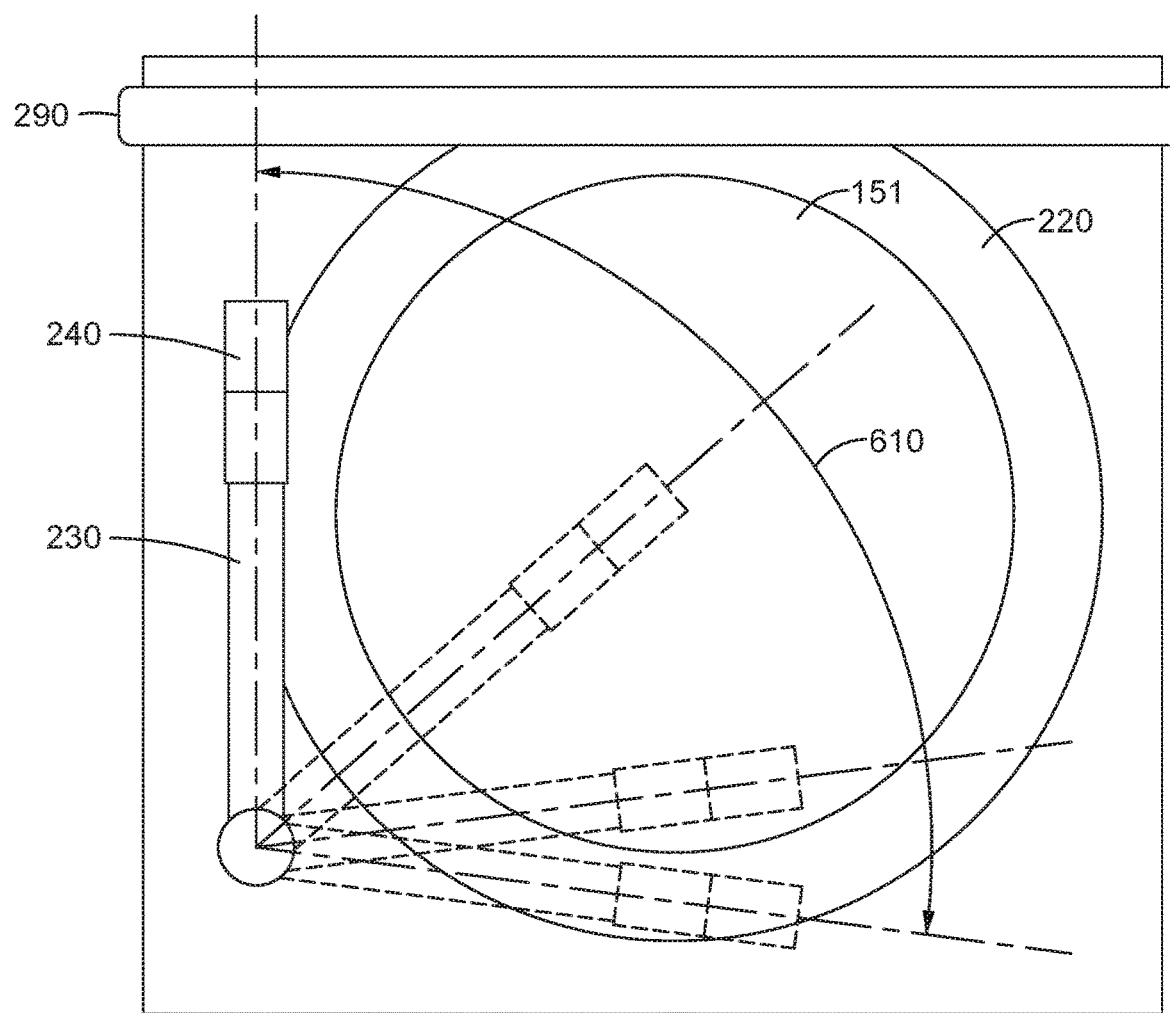
FIG. 6 illustrates a schematic view of a sweep arm, according to one or more embodiments.

FIG. 6 illustrates a path 610 of the sweep arm 230 and nozzle mechanism 240 over the wafer 151 during the cleaning cycle according to one or more embodiments. As illustrated in FIG. 6, the wafer 151 is disposed over and is retained by the gripper assembly 220. The path 610 may be an arcuate path that is parallel to a device side surface (front surface) of the wafer 151. Alternatively, other shapes and/or lengths of paths may be utilized. For example, the range of motion of the sweep arm 230 may be varied. As illustrated in FIG. 6, the nozzle mechanism 240 coupled to the end of the sweep arm 230 passes over the center of the wafer in an arcuate path. The position of the sweep arm 230 and/or the nozzle mechanism 240 may be adjusted to ensure that the nozzle mechanism 240 passes over the center of a rotating wafer 151 during processing. Further, at least one of the position of the sweep arm 230 and the position of the nozzle mechanism 240 may be adjusted such that the nozzle mechanism 240 passes over a portion of the wafer 151 other than the center of the wafer 151. For example, the nozzle mechanism 240 may be moved relative to the sweep arm 230 and/or the sweep arm 230 may be moved relative to sweep arm shaft 232 to vary the position of the nozzle mechanism 240 relative to surface of the wafer 151. Further, the axial distance between nozzle mechanism 240 and the surface of the wafer 151 may be varied to aid in the cleaning process.

The sweep arm drive motor 234 moves the sweep arm shaft 232 and in-turn, the sweep arm 230 and nozzle mechanism 240 over the wafer 151 during the cleaning processes. The sweep arm drive motor 234 may control the scan rate of the nozzle mechanism 240. For example, the sweep arm drive motor 234 may control the speed at which the nozzle mechanism scans moves along path 610.

FIG. 6 further illustrates the spray bars 290. The spray bars 290 may pre-treat the wafer 151 as the wafer is inserted into the cleaning module 200 and rinse the wafer 151 as the wafer is removed from the cleaning module 200. The spray bars 290 may include one or more nozzles configured to output one or more fluids that are configured. Alternatively, the spray bars 290 may include a tube having holes designed to maintain uniform flow across the spray bar 290. For example, as the wafer 151 passes by the spray bars 290 when the wafer 151 is transferred into and out of the cleaning module 200, and the spray bars 290 apply a rinsing fluid to the wafer 151 to ensure that the wafer 151 remains wet during the transfer process, and particles do not reattach to the wafer 151 as it is removed from the cleaning module 200.

Figure 7A:
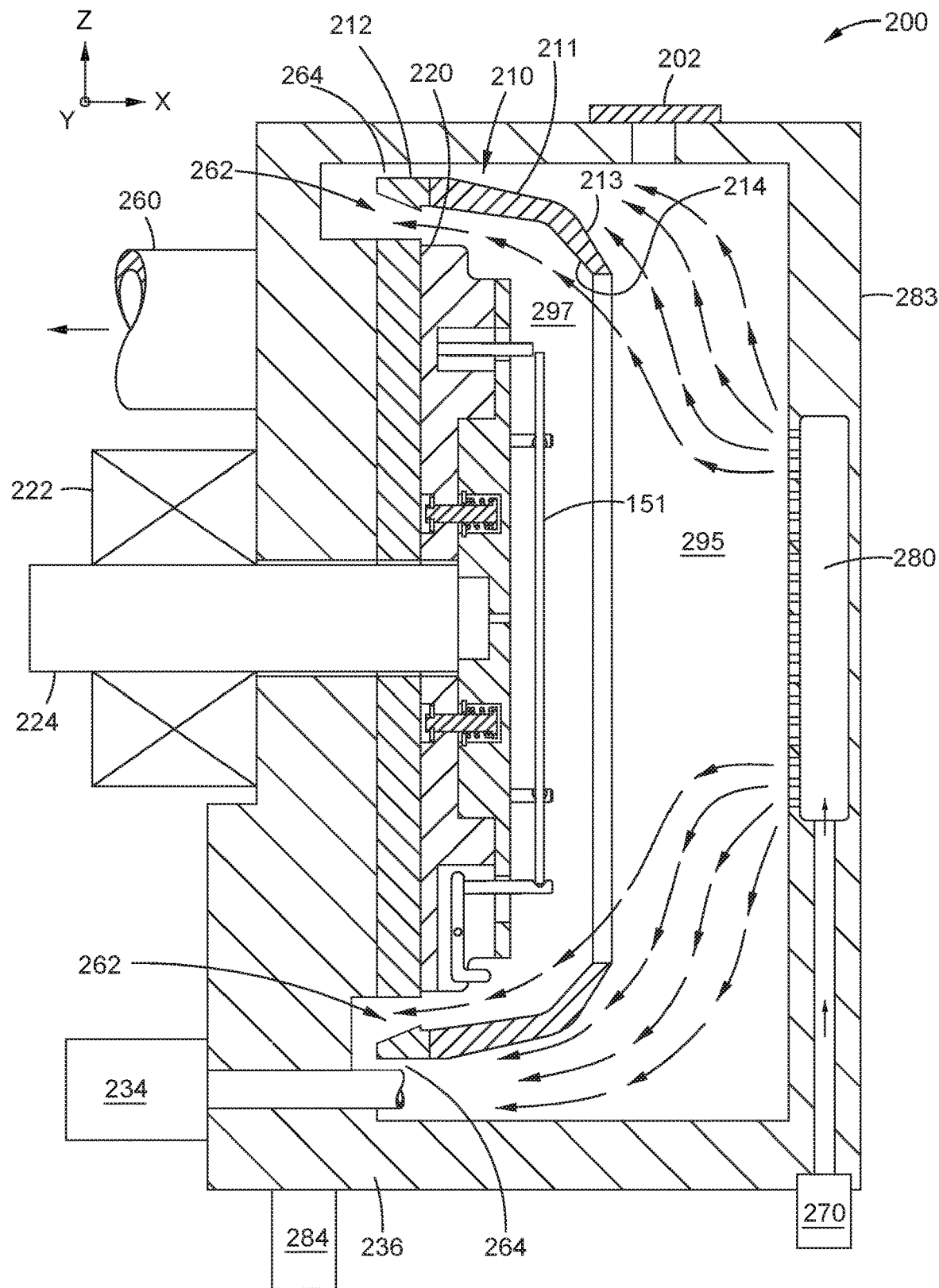
FIG. 7A illustrates air flow within a cleaning module, according to one or more embodiments.

FIG. 7A illustrates an example of an air flow pattern within the cleaning module 200. As is illustrated by the air flow pattern, re-circulation is minimized as the air flow flows out of plenum 280 and out of exhaust 260. In general, the shape of the annular inner surface 214 of the wall 213 and the outer surface of the catch cup 210 aides in reducing air re-circulation and trapping fluids flowing off of the surface of the wafer as it is rotated about the rotational axis 313. In one embodiment, the annular inner surface 214 of the wall 213 has an inverted shape such that airflow within the processing volume 297 is along the outer edge of the gripper assembly 220 and into the exhaust 260. Further, the outer surface of the catch cup 210 may be shaped such that airflow within the interior volume 295 is around the outside of the catch cup 210 and into the exhaust 260. Further, the shape of the outer surface of the catch cup 210 may force the majority of the airflow to travel around the outside of the catch cup 210 and into the exhaust 260.

The one or more sides of the drain holes 262 may be angled, such that the distance between the sides of the drain holes 262 differs. For example, the drain holes 262 may be tapered. Tapering the drain holes may increase the fluid pumping rate from area inside the catch cup 210. Further, a labyrinth 264 may be formed between the catch cup 210 and the housing of the cleaning module 200. The labyrinth 264 may be configured to at least partially limit moisture from flowing back through the labyrinths 264 and into the interior volume 295.

The plenum 280 may be configured to control the air flow within the cleaning module 200 to minimize re-circulation. For example, the plenum 280 may increase and/or decrease the amount of air flowing into the cleaning module 200 to minimize re-circulation. The air flow re-circulation can be minimized due to the configuration of the catch cup 210, the gripper assembly 220, the plenum 280, the exhaust 260, the spray bar 290, the drain 284, and the air intake 270 disclosed herein.

In one embodiment, during the cleaning process, uniform air flow across the surface of the wafer 151 is generated by the exhaust 260 and the plenum 280. In various embodiments, the exhaust 260 is configured to provide a path for air to flow out of the cleaning module 200 to prevent particles from reattaching to the surface of the wafer 151. As is described above, air may be provided to the plenum 280 by the air intake 270, and exhausted from the cleaning module 200 by the exhaust 260. The plenum 280 may be a shower head style plenum. Further, the geometry of the exhaust 260 and/or the shape of the catch cup 210 (or the shape of the first catch cup 211 and/or the second catch cup 212) may be optimized to reduce re-circulation within the cleaning module 200. Reducing re-circulation at least minimizes re-attachment of particles and any vaporized cleaning fluids on the wafer 151. The geometry of the exhaust 260 and/or the shape of the catch cup 210 (or the shape of the first catch cup 211 and/or the second catch cup 212) may generate the labyrinth 264 behind the catch cup 210, minimizing re-circulation. Further, drain 284 provides a path for the cleaning fluids and rinsing fluids to be removed from the cleaning module 200, minimizing re-circulation within the cleaning module 200. The plenum 280 may be positioned along wall 283 of the cleaning module 200 such that the plenum 280 is positioned proximate the nozzle mechanism 240, and the wafer 151 is between the plenum 280 and the exhaust 260.

Figure 7B:
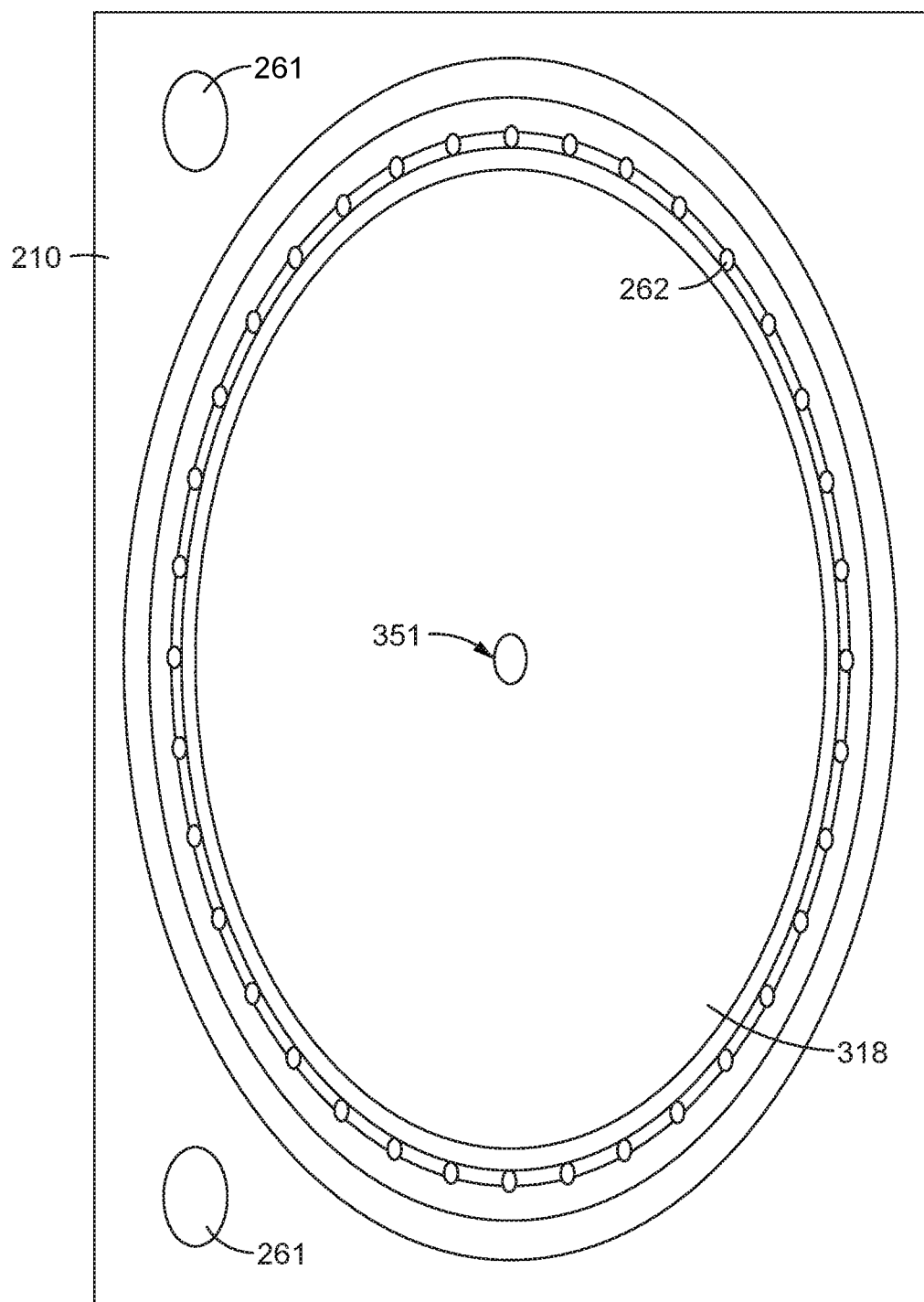
FIG. 7B illustrates a partial schematic view of the drain holes, according to one or more embodiments.

FIG. 7B is a schematic top view of portion of the gripper assembly 220, apertures 351 and the drain holes 262, according to one or more embodiments. Each of the drain holes 262 is fluidly coupled to the drain 284. Further, as the gripper assembly 220, the catch cup 210 and the wafer 151 are rotated, fluid is forced through drain holes 262, where it is removed from the cleaning module by drain 284.

The drain holes 262 may be positioned along the edge of the catch cup 210 (or the second catch cup 212) such that moisture flows into the drain holes 262 during the cleaning process. The drain holes 262 may aid in removing moisture from the cleaning module during the cleaning cycle to ensure that all particles removed from the surface of the wafer 151 during the cleaning process are removed from the cleaning module 200. In various embodiments, at least two drain holes 262 are utilized. In other embodiments, more than two drain holes 262 are utilized.

The drain holes 262 may be configured to reduce air and/or fluid recirculation within the cleaning module 200. For example, the size and/or orientation of the drain holes 262 may be configured to reduce air and/or fluid recirculation. The drain holes 262 may have a slanted or angled orientation with the surface of the catch cup 210 (or the second catch cup 212).

In one embodiment, the drain 284 and/or exhaust 260 may include one or more internal labyrinth seal that minimize the flow of moisture into the drain holes (or ports) 262.

The drain 284 may be utilized to remove excess moisture and/or all fluids at the completion of a cleaning cycle from the cleaning module 200. In one embodiment, moisture flows through drain holes 262 and into the drain 284. For example, as the wafer 151 is rotated, the drain holes 262 are configured to ensure that moisture does not collect on the wafer 151 and is removed via the drain 284. In one embodiment, one or more O-rings or other sealing members may be positioned where the drain 284 meets the cleaning module 200.

FIG. 7B further illustrates exhaust holes 261 which are connected to the exhaust 260 and function to provide a path for air to flow within the processing volume 297, around the wafer 151 and into the exhaust 260. In one embodiment, the exhaust holes 261 aid in minimizing re-circulation within the cleaning module.

Figure 8:
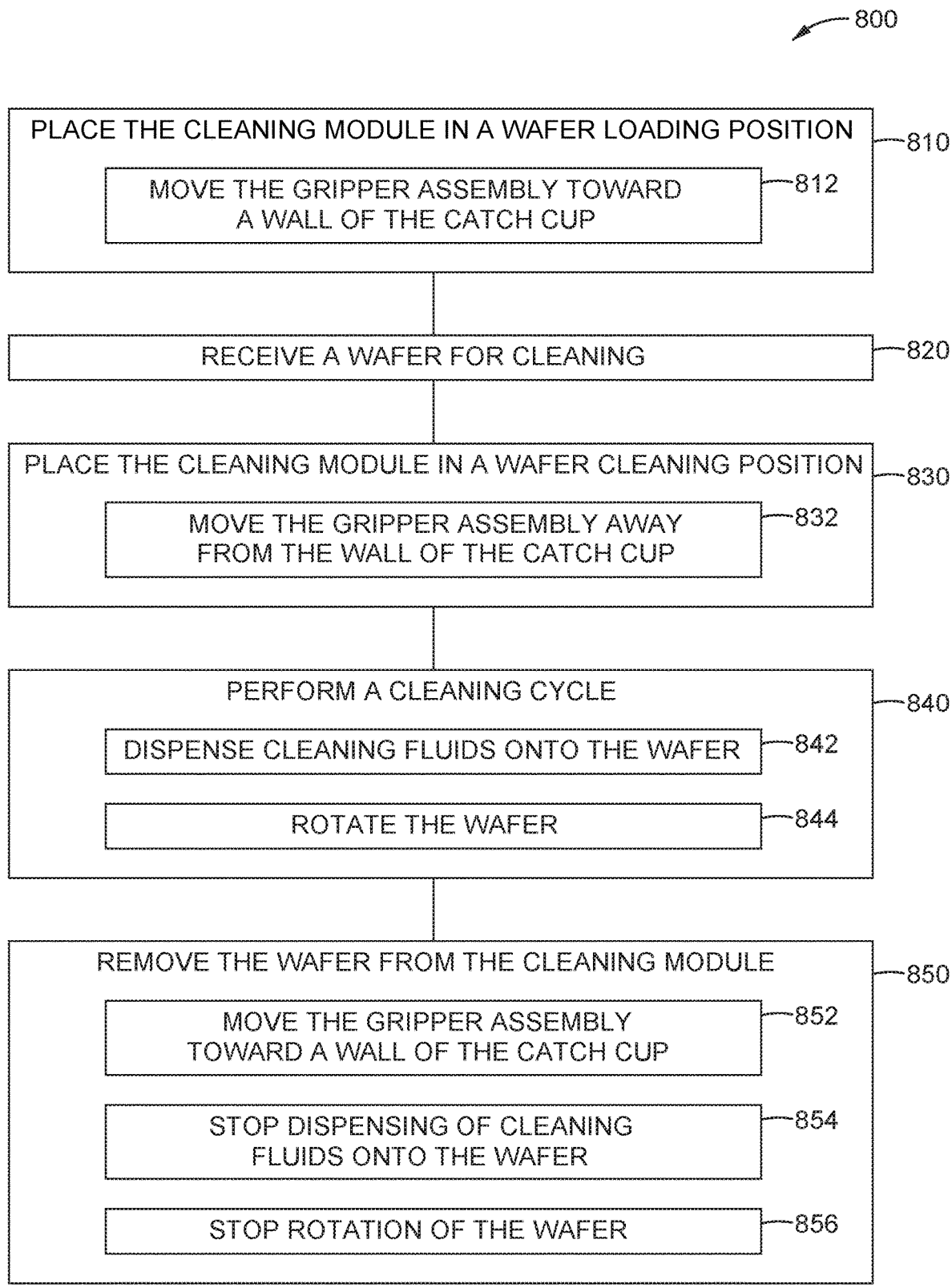
FIG. 8 illustrates a method for cleaning a wafer, according to one or more embodiments.
Figure 9A:
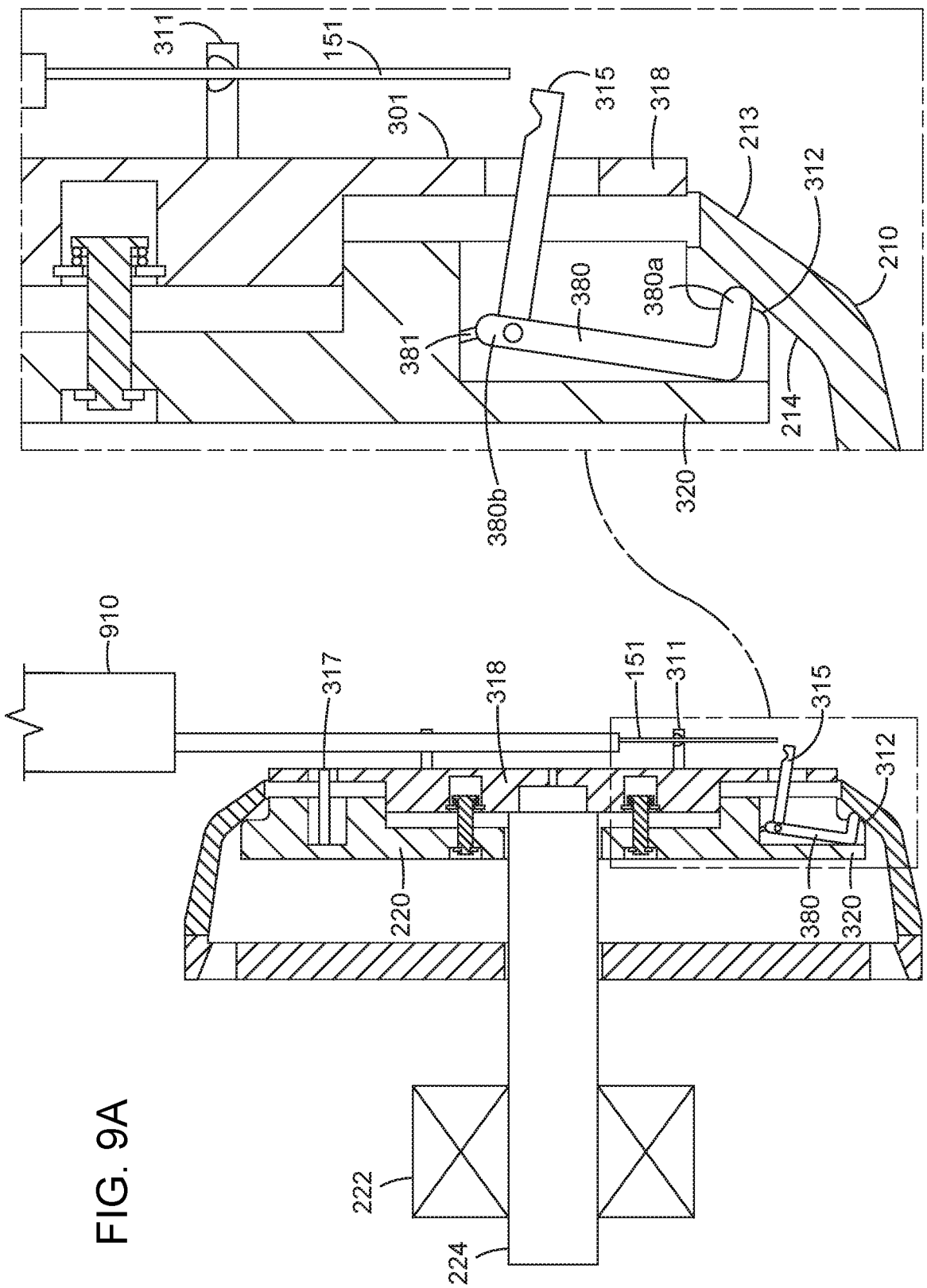
Figure 9B:
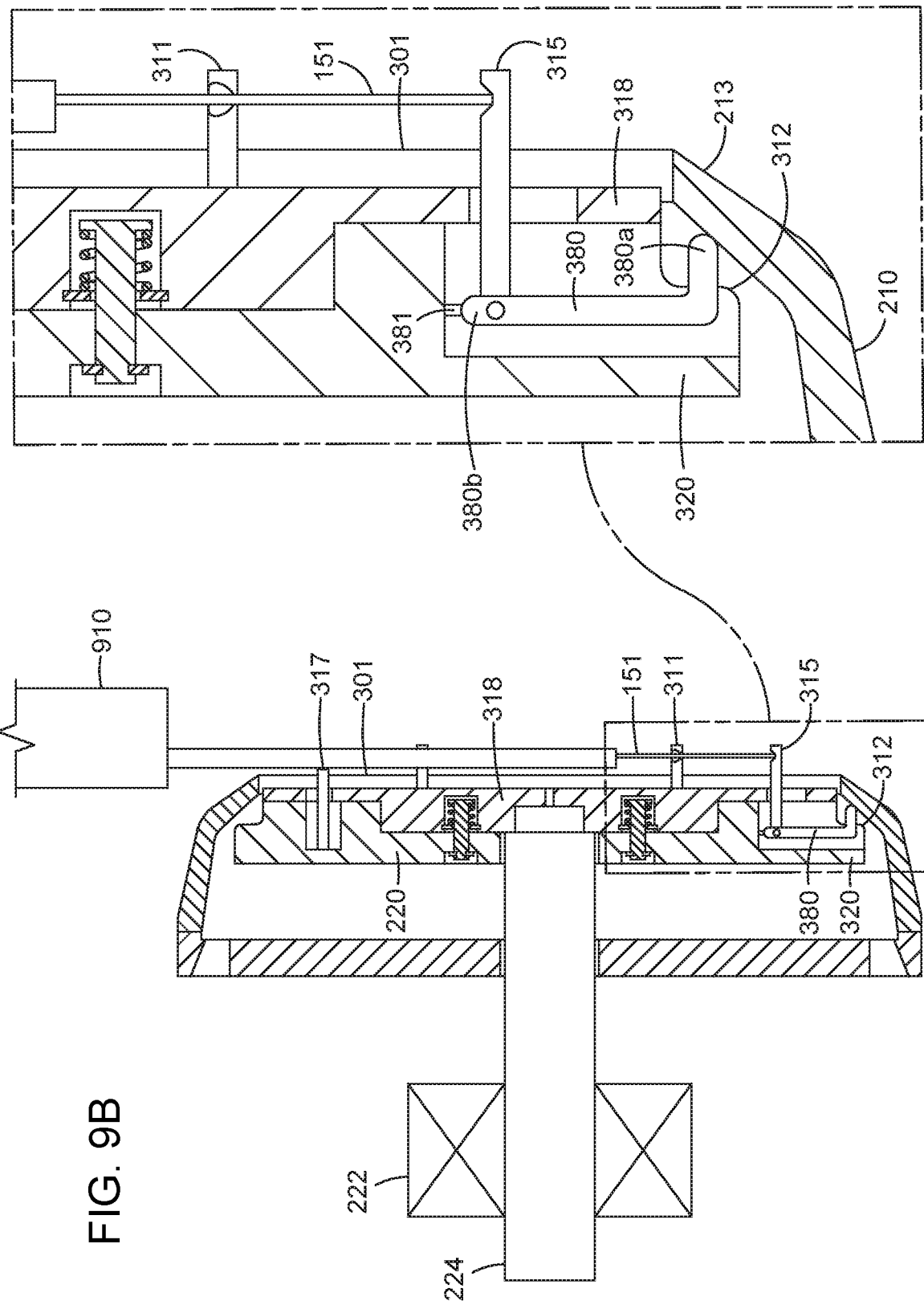

FIG. 8 illustrates method 800 for cleaning a wafer (e.g., wafer 151), according to one or more embodiments. At operation 810, a cleaning module is placed in a wafer loading position, as illustrated in FIG. 9A which is discussed further below. For example, the lid 202 is opened and the gripper assembly 220 of the cleaning module 200 is moved in a lateral direction (e.g., X direction) parallel to rotational axis 216 toward the annular inner surface 214 of the wall 213 of the catch cup 210. Moving the gripper assembly 220 toward the wall 213 places the gripper assembly 220 in a loading position. In one embodiment, placing the gripper assembly 220 in the loading position includes moving the gripper assembly 220 via shaft 224 and drive motor 222 toward the wall 213 (e.g., operation 812). For example, the drive motor 222 drives shaft 224 in the lateral direction moving the gripper assembly 220 toward the wall 213 such that, the feature 312 of the second plate assembly 320 of the gripper assembly 220 contacts the annular inner surface 214 of the wall 213. When the feature 312 contacts the wall 213, movement of the second plate assembly 320 is halted while first plate assembly 318 continues to move such that at least a portion of the first plate assembly 318 is positioned within the interior volume 295. The first plate assembly 318 remains coupled to the second plate assembly 320 through the spring mechanisms 330. For example, as the first plate assembly 318 moves in the positive X direction and movement of the second plate assembly 320 is halted, the spring mechanisms 330 expand, maintaining a coupling between the first plate assembly 318 and the second plate assembly 320.

Each of the elements 380 is coupled to a respective one of the gripping pins 315, and as the elements 380 contact the wall 213, each of the gripping pins 315 is tilted (or moved) away from each other moveable pin. For example, as is shown in FIG. 9A, as element 380 contacts the wall 213, the element 380 pivots and the gripping pin 315 is moved in an outward direction, tilting away from the center of gripper assembly 220. moving the gripping pins 315 includes moving the gripping pins 315 toward the outer edge of the gripper assembly 220 such that they are tilted away from the other pins (e.g., the loading pins 311 and other ones of the gripping pins 315), and the separation distance between the gripping pins 315 is increased.

The gripper assembly 220 is placed in the extended position 300b such that the wafer 151 may be received for cleaning and/or the wafer 151 to be removed from the cleaning module 200 after the cleaning cycle has been completed. For example, the gripper assembly 220 may be driven by the drive motor 222 and the shaft 224 such that at least a portion of the first plate assembly 318 extends beyond the wall 213 of the catch cup 210 and into the interior volume 295, and is in the extended position 300b.

FIG. 9A shows an embodiment where the gripper assembly 220 is positioned in the loading position. In the embodiment of FIG. 9A, gripping pins 315 have been moved outward and the first plate assembly 318 has been moved away from second plate assembly 320. Further, at least the loading pins 311 reside outside the catch cup 210 and in the interior volume 295 such that wafer 151 may be received from a robot onto the loading pins 311. In the loading position, the surface 301 of the first plate assembly 318 may be parallel to the outer edge of the wall 213, recessed from the wall 213 of the catch cup 210 within the processing volume 297, or outside the wall 213 of the catch cup 210 and in the interior volume 295. Alternatively, when in the in loading position, the surface 301 is parallel to the outer edge of the wall 213 or within the processing volume 297 while the loading pins 311 reside outside the wall 213 and in the interior volume 295.

Controller 190 may provide instructions to drive motor 222 to move the shaft 224 in the lateral direction along rotational axis 313 of FIG. 3A, moving the gripper assembly 220 in the lateral direction. Further, the controller 190 may receive indicia indicating that the cleaning module 200 is prepared to receive a wafer for cleaning.

At operation 820 of the method 800, a wafer is received for cleaning. For example, in one embodiment, the robot 910 inserts the wafer 151 into the gripper assembly 220 for cleaning. As is illustrated in the embodiment of FIG. 9A, the robot 910 inserts the wafer 151 such that it is held by (e.g., rests in grooves of) the loading pins 311. For example, the robot 910 is configured to place the wafer 151 into the loading pins 311 of the gripper assembly 220.

During entry into the cleaning module 200, one or more spray bars 290 may pre-treat the wafer 151 by applying one or more fluids to the wafer 151 as it is inserted within the cleaning module 200. In one embodiment, the wafer 151 may be received after the wafer 151 has been cleaned within one or more other cleaning modules (e.g., megasonics cleaning modules 161, pre-clean modules 162, or brush box cleaning modules 164).

After the wafer 151 has been fully inserted into the loading pins 311, the robot 910 releases the wafer 151 and is retracted from the cleaning module 200.

Controller 190 may provide instructions to the spray bars 290 to begin the pre-treatment process. Further, the controller 190 may receive indicia indicating that the wafer 151 has been inserted into the cleaning module 200. For example, the controller 190 may receive sensor data from the sensing device 294 indicating that wafer 151 has been placed within the cleaning module 200 and generate instructions for the spray bars 290 to begin the pre-treatment process.

At operation 830 of the method 800, a cleaning module is placed in a cleaning position. For example the cleaning module 200 may be placed in a cleaning position by moving the gripper assembly 220 away the wall 213 as shown in operation 832. The drive motor 222 drives shaft 224 to retract the gripper assembly 220 into the processing volume 297. For example, the drive motor 222 may drive the shaft 224 in a lateral or horizontal direction (e.g., X direction) along rotational axis 216 to move the gripper assembly 220 away from the wall 213.

As the drive motor 222 moves the gripper assembly 220 away from the wall 213, the first plate assembly 318 is brought back into contact with the second plate assembly 320, and contact between features 312 and the wall 213 is ended. Further, the elements 380 pivot to the closed position and the gripping pins 315 are moved toward each other and grip the wafer 151. The gripping pins 315 exert a pressure onto the wafer to hold the wafer 151. Each of the gripping pins 315 may be coupled to a spring mechanism which exerts force to grip the wafer 151. The drive motor 222 may drive the shaft 224 until the second plate assembly 320 contacts the catch cup 210.

Further, as the gripper assembly 220 is moved in the negative X direction (e.g., horizontally away from the wall 213), the feature 312 moves away from the wall 213 and the spring mechanisms 330 keeps the second plate assembly 320 clamped to the first plate assembly 318. The first plate assembly 318 and the second plate assembly 320 may be brought into contact with each other when the features 312 are no longer in contact the wall 213.

Figure 9C:
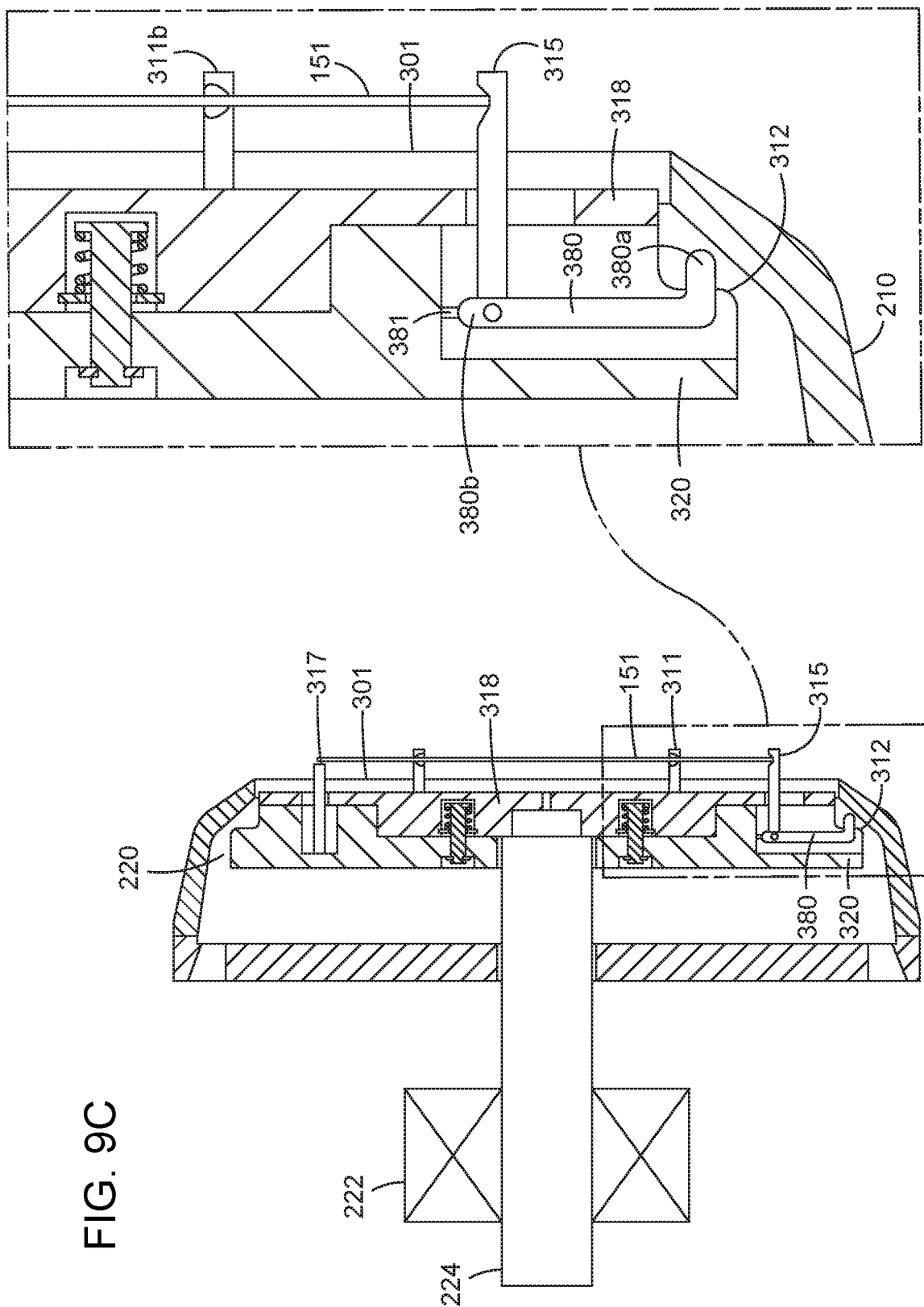

As shown in the embodiment of FIG. 9C, the wafer 151 is held by the gripping pins 315 of the gripper assembly 220. In the illustrated embodiment, the gripping assembly 220 has been moved in the X direction (e.g., parallel to the rotational axis 216) away from the wall 213 such that the elements 380 are moved away from the wall 213 and the gripping pins 315 grip the wafer 151. Further, the robot 910 has been retracted from the interior volume 295 of the cleaning module 200.

The controller 190 may be configured to provide instructions to drive motor 222 to move the shaft 224 in the lateral direction away from the wall 213, moving the gripper assembly 220 in the lateral direction and away from the wall 213. The controller 190 may initiate movement of the gripper assembly 220 based on sensor data received from the sensing device 294 indicating that the wafer 151 is being held by the gripper assembly 220 and the robot 910 has been removed from the interior volume 295. Once in the gripper assembly 220 has been placed in the retracted position 300a, a cleaning cycle may be initiated.

At operation 840 a wafer is cleaned. The wafer 151 and the gripper assembly 220 are placed in a cleaning position such that reside completely within the processing volume 297. Performing the cleaning cycle includes positioning the sweep arm over the wafer 151 and dispensing fluids onto the front and back surfaces of the wafer 151 via the nozzle mechanism 240 and the shaft 224, as shown by operation 842. Further, performing the cleaning cycle includes rotating the wafer 151 as shown by operation 844. For example, the drive motor 222 may simultaneously rotate the wafer 151, the catch cup 210 and the gripper assembly 220. The position of the wafer 151 within the processing volume 297 may be altered during the cleaning process. For example, the distance between the wafer 151 and the second catch cup 212 may be varied. The rate of application of fluids to the front and backs surfaces of the wafer 151 via the nozzle mechanism 240 and the shaft 224 may be altered. For example, fluids may be applied to the front and back surfaces of the wafer 151 at the same rate or at different rates. Alternatively, that rate at which fluids are applied to the front and back surfaces of the wafer 151 may be varied during a cleaning process or a rinsing process. For example, the rate at which fluids are applied to the front surface of the wafer 151 via the nozzle mechanism may be increased or decreased during a cleaning or rinsing process. Further, the rate at which fluids are applied to the back surface of the wafer 151 via the shaft 224 may be increased or decreased during a cleaning or rinsing process.

Cleaning the wafer 151 includes continuously rotating the catch cup 210 (e.g., the first catch cup 211 and the second catch cup 212), the gripper assembly 220 and the wafer 151 while cleaning fluids are applied to the first side (front surface) and second side (back surface) of the wafer 151. Rotating the catch cup 210, the gripper assembly 220 and the wafer 151 while cleaning fluids are applied aids in minimizing and/or eliminating reattachment of particles to either surface of the wafer 151. The drive motor 222 may be configured to simultaneously rotate the catch cup 210, the gripper assembly 220 and the wafer 151. For example, the drive motor 222 may rotate the shaft 224 to rotate the catch cup 210, the gripper assembly 220, and the wafer 151. The wafer 151 is rotated at a speed in a range of about 500 RPM to about 1000 RPM such that the fluids are removed from the surface of the wafer 151. Alternatively, the wafer 151 may be rotated at speeds, either less than 500 RPM or greater than about 1000 RPM. Further, the rate at which the wafer 151 is rotated may be varied during the cleaning process.

First cleaning fluids may be applied to a back surface (e.g., the surface of the wafer 151 facing the surface 301) of the wafer 151 via the fluid source 223, the shaft 224 and the one or more apertures 351. Further, second fluids may be applied to front surface (e.g., the surface of the wafer 151 facing away from the surface 301) of the wafer 151 via the nozzle mechanism 240. The sweep arm drive motor 234 may move the sweep arm 230 such that the nozzle mechanism 240 is moved over the front surface of the wafer 151 in an arcuate path. The nozzle mechanism 240 may be configured to apply cleaning fluids to the front surface of the wafer 151 during the cleaning process. The fluids may include cleaning chemistries and/or rinsing agents. The cleaning fluids may be applied to the front surface and the back surface of the wafer 151 at substantially the same time. Further, cleaning fluids may be applied to the front surface of the wafer 151 independent to that of applying cleaning fluids to the back surface of the wafer 151. For example, cleaning fluids may be applied to the front surface of the wafer 151 and cleaning fluids may be applied to the back surface of the wafer 151 during one or more overlapping and non-overlapping periods. During a first non-overlapping period one or more cleaning fluids may be applied to the front surface of the wafer 151, and during a second non-overlapping period one or more cleaning fluids may be applied to the back surface of the wafer 151. The overlapping and non-overlapping periods of a cleaning cycle may occur in any order. Further, the number and/or order of overlapping and non-overlapping periods may vary from cleaning cycle to cleaning cycle. Additionally, while in the cleaning position, splashing of the cleaning fluids back onto the wafer 151 is at least reduced or eliminated.

FIG. 9D illustrates an embodiment where the wafer 151 is in the cleaning position. The cleaning position includes positioning the gripper assembly 220 within the processing volume 297. Further, once the wafer gripper 210 has been placed in the cleaning position, the cleaning cycle may be initiated.

During at least one of the cleaning process, the loading process and the unloading process airflow within the cleaning module 200 mitigates re-circulation from occurring, preventing particles from reattaching the surface of the wafer 151.

The controller 190 may receive indicia indicating that the gripper assembly 220 is positioned in the cleaning position. The indicia may be provided within sensor data from the sensing device 294. Further, the controller 190 may be configured to control flow of the cleaning fluids through the shaft 224 and the aperture(s) 351 as well as the motion of and control of fluids through nozzle mechanism 240. The controller 190 may provide instructions to the sweep arm drive motor 234 to move the nozzle mechanism 240 across the surface of the wafer 151. Further, the controller 190 may output instructions to the nozzle mechanism to dispense cleaning fluids from one or more of the nozzles. Further, the controller 190 may control the timing of the nozzles, such that cleaning fluids are output at different times. For example, one nozzle may be controlled to start dispensing cleaning fluids before another nozzle. One or more of the nozzles may be configured to output a cleaning fluid while at least another one of nozzles does not output a cleaning fluid.

At operation 850 a cleaned wafer is remove from the cleaning module. Removing the wafer 151 from the cleaning modules includes operation 852, moving the gripper assembly 220 toward the wall 213 to place the gripper assembly 220 in an unloading position. The unloading position may correspond to moving the first plate assembly 318 of the gripper assembly 220 at least partially into the interior volume 295 and placing the gripping pins 315 in a retracted and tilted position. For example, the loading position may include positioning one or more of the pins 311 and the surface 301 of the first plate assembly 318 in the interior volume 295. Further, removing the wafer from the cleaning module includes operation 854, stopping dispensing of the cleaning fluids, and operation 856, and stopping rotation of the wafer. The catch cup 210, the gripper assembly 220, and the wafer 151 may be continuously rotated by the drive motor 222 until the wafer 151 is in the interior volume 295.

At the end of the cleaning cycle, the gripper assembly 220 is moved into the loading position by the drive motor 222 and shaft 224. Further, the nozzle mechanism 240 may cease spraying fluids and the nozzle mechanism 240 and the sweep arm 230 may be moved away from the wall 213 at the end of the cleaning cycle and before the gripper assembly 220 is moved. At the end of the cleaning cycle, the nozzle mechanism 240 and the sweep arm 230 may be positioned such that they do not interfere with movement of the gripper assembly 220 and robot 910.

At the end of the cleaning cycle dispensing of the cleaning fluids may be stopped. Further, before the gripper assembly 220 is moved toward wall 213, the dispensing of the cleaning fluids may be stopped. Alternatively, fluids may be continued to be disposed onto the back surface of the wafer 151 while dispensing of the fluids to the top surface is stopped.

Further, while the gripper assembly 220 is moved, the gripper assembly 220, and the catch cup 210 may be rotated as described above to minimize reattachment of particles to the wafer 151. In one embodiment, the rotating the gripper assembly 220 and the catch cup 210 while gripper assembly 220 is move reduces splashing of cleaning fluids back onto the wafer 151. Further, rotation of the gripper assembly 220, and the catch cup 210, is stopped before the elements 380 contact the wall 213. Additionally, the rotation of the gripper assembly 220 and the catch cup 210 may be stopped just before the elements 380 contact the wall 213.

FIG. 9A illustrates an example embodiment where the gripper assembly 220 is positioned in the unloading position such that the robot 910 may remove the wafer 151 from the cleaning module 200. The robot 910 may access the cleaning module through the opening unobstructed by lid 202, pick up the clean wafer 151 and remove the clean wafer 151 from the cleaning module 200.

The controller 190 may provide instructions to drive motor 222 to move the shaft 224 in the lateral direction toward the wall 213, moving the gripper assembly 220 in the lateral direction and toward the wall 213 to place the gripper assembly 220 in an unloading position such that the robot 910 may remove the cleaned wafer 151 from the cleaning module 200. Further, the controller 190 may provide instructions to the drive motor 222 to stop rotation of the catch cup 210 and the gripper assembly 220, once the wafer 151 is positioned in the interior volume 295. The controller 190 may also provide instructions to the nozzle mechanism 240 and/or fluid source 223 to stop dispensing cleaning fluids. The controller 190 may receive sensor data from the sensing device 294 indicating that the wafer 151 has been placed within the unloading position and initiate the unloading process in response to the sensor data.

Figure 10:
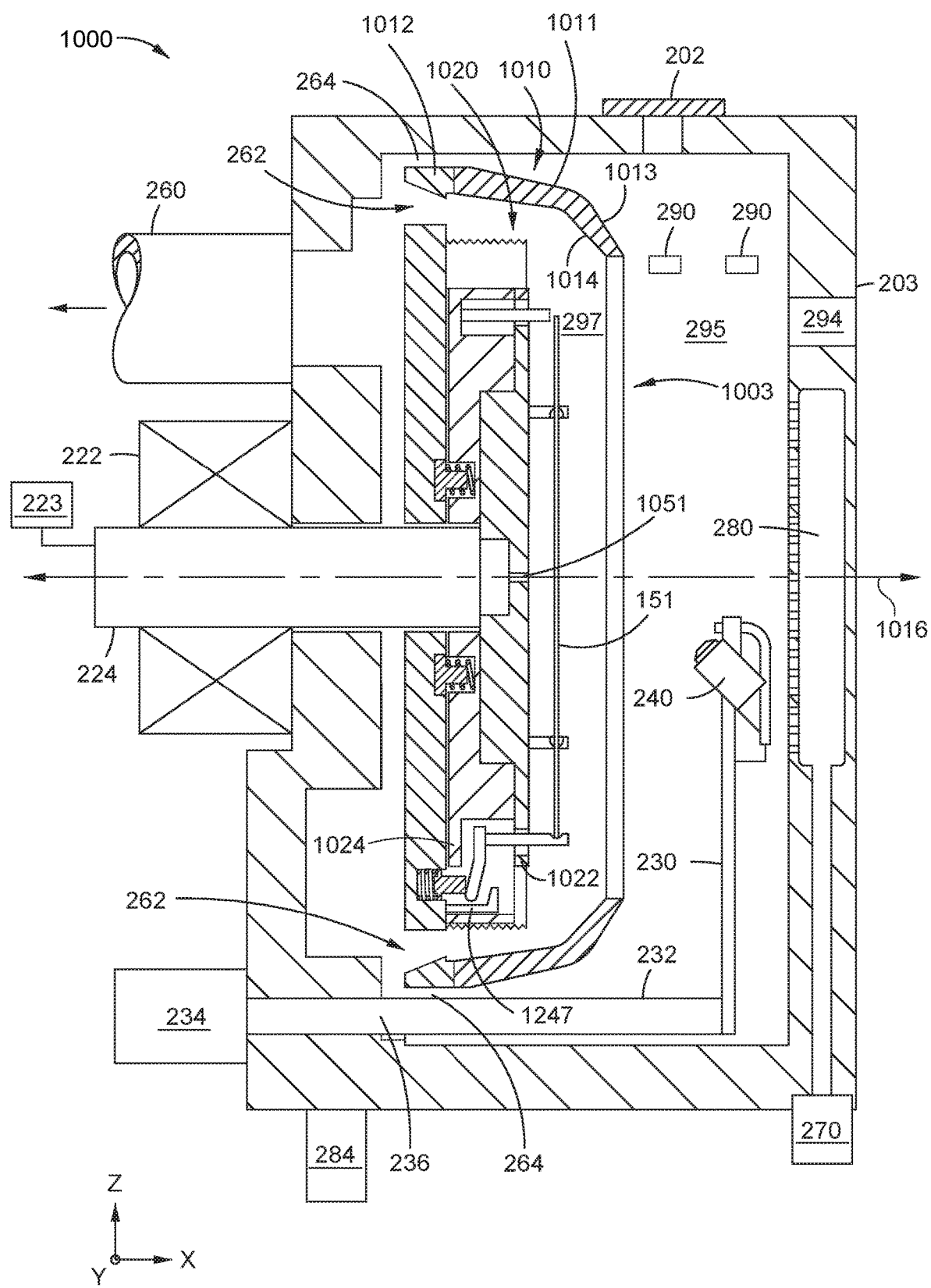
FIG. 10 is a schematic cross sectional side view of cleaning module, according to one or more embodiments.

FIG. 10 is a cross sectional view illustrating a non-contact vertical cleaning module, e.g., a cleaning module 1000, for a wafer processing system, according to one or more embodiments. The cleaning module 1000 is configured to clean the wafer 151 in a vertical orientation (e.g., perpendicular to rotational axis 1016). The cleaning module 1000 is similar to that of cleaning module 200. For example, both cleaning modules 200 and 1000 include the nozzle mechanism 240, the plenum 280, the exhaust 260, the spray bars 290, the drain 284, the air intake 270, the drive motor 222, the shaft 224, and the fluid source 223. These elements are described in greater detail in the above. However, the wafer gripping device 1003 of the cleaning module 1000 differs from the wafer gripping device 203 of the cleaning module 200.

As with the cleaning module 200, the cleaning module 1000 may receive a wafer, e.g., wafer 151, to be cleaned after the wafer has been cleaned within one or more of the megasonics cleaning modules 161, pre-clean modules 162, brush box cleaning modules 164, and before the wafer is placed in a corresponding Marangoni drying tank (e.g., drying tank 168). The cleaning module 1000 may be placed any wherein within the wafer cleaning cycle and/or the edge/bevel cleaning process. The cleaning module 1000 may be utilized to remove contamination from the wafer that if not removed, may lead to wafer not meet quality standards and being discarded.

The wafer gripping device 1003 is configured to support the wafer 151 in a vertical orientation (e.g., an orientation perpendicular to the rotational axis 1016). The wafer gripping device 1003 includes a catch cup 1010 and a gripper assembly 1020. The catch cup 1010 is configured similar to that of the catch cup 210. For example, the catch cup 1010 may be comprised of a single piece of material as is described with regard to the catch cup 210. Alternatively, the catch cup 1010 may include a first catch cup 1011 and a second catch cup 1012. The first catch cup 1011 and the second catch cup 1012 may be coupled to each other similar to that of the first catch cup 211 and the second catch cup 212.

The catch cup 1010 includes a wall 1013. The wall 1013 is configured similar to that of the wall 213 as described above. The wall 1013 includes an annular inner surface 1014 which is configured similar to that of the annular inner surface 214 as described above. The annular inner surface 1014 has an angled portion that is symmetric about a central axis of the wafer gripping device 1003. The catch cup 1010 is described in greater detail below.

The drive motor 222 is coupled to the gripper assembly 1020. The drive motor 222 is described in greater detail above. The drive motor 222 may include a first motor configured to control rotation of the gripper assembly 1020 and the catch cup 1010 about rotational axis 1016, and a second motor configured to control horizontal movement of the gripper assembly 1020. The horizontal movement is generally a movement in an axial direction of the gripper assembly 1020, or movement in a direction parallel to the rotational axis 1016. Horizontal movement corresponds to motion in the X direction. Further, horizontal movement of the gripper assembly 1020 may be independent of movement of the catch cup 1010. Additionally, the gripper assembly 1020 and the catch cup 1010 may be configured to be rotated together, e.g., the gripper assembly 1020 and the catch cup may be simultaneously rotated.

As described with regard to the cleaning module 200 above, the spray bars 290 may apply a pre-treatment fluid to the wafer 151 as the wafer 151 is inserted into the cleaning module 1000 and/or rinse the wafer 151 with a rinsing fluid as it is removed from the cleaning module 1000. The spray bars 290 may be utilized to apply fluids to the wafer 151 during when the wafer 151 is not being gripped and cleaned.

As described with regard to the cleaning module 200a above, the drain 284 may be utilized to remove excess moisture from the cleaning module 1000. The drain 284 may remove excess cleaning fluids from the cleaning module 1000 during a cleaning process.

As described with regard to the cleaning module 200, the plenum 280 may receive air to be circulated within the cleaning module 1000 from the air intake 270. Further, air may be exhausted from the cleaning module 1000 by the exhaust 260. The air intake 270 and the plenum 280 are positioned at the front of the cleaning module 200 and the exhaust 260 is positioned at the back of the cleaning module 1000. Alternatively, the position of the exhaust 260 and the air intake 270 may be reversed, such that the exhaust 260 is positioned at the front of the cleaning module 1000 and the air intake 270 is positioned at the back of the cleaning module 1000. Further, the plenum 280 and exhaust may be configured to control the flow of air within the cleaning module 1000 to prevent particles from reattaching to the surface of the wafer 151.

The cleaning module 1000 may further include a sensing device 294. The sensing device 294 device is described in greater detail above. The sensing device 294 may detect the wafer 151 within the cleaning module 1000. For example, the sensing device 294 may detect the wafer 151 within the interior volume 295. Further, the sensing device 294 may detect the wafer 151, while the wafer 151 is being held by the gripper assembly 1020. The sensing device 294 may detect when the wafer 151 has been properly or improperly loaded into the gripper assembly 1020. Further, the sensing device 294 may detect when the wafer 151 has been dropped or fallen out of the gripper assembly 1020.

The controller 190 may control the functionality of the cleaning module 1000 similar to that of the cleaning module 200. For example, the controller 190 may control the functionality of at least the drive motor 222, the gripper assembly 1020, the spray bars 290, the sweep arm 230, the nozzle mechanism 240, the air intake 270 and/or the exhaust 260.

Figure 11:
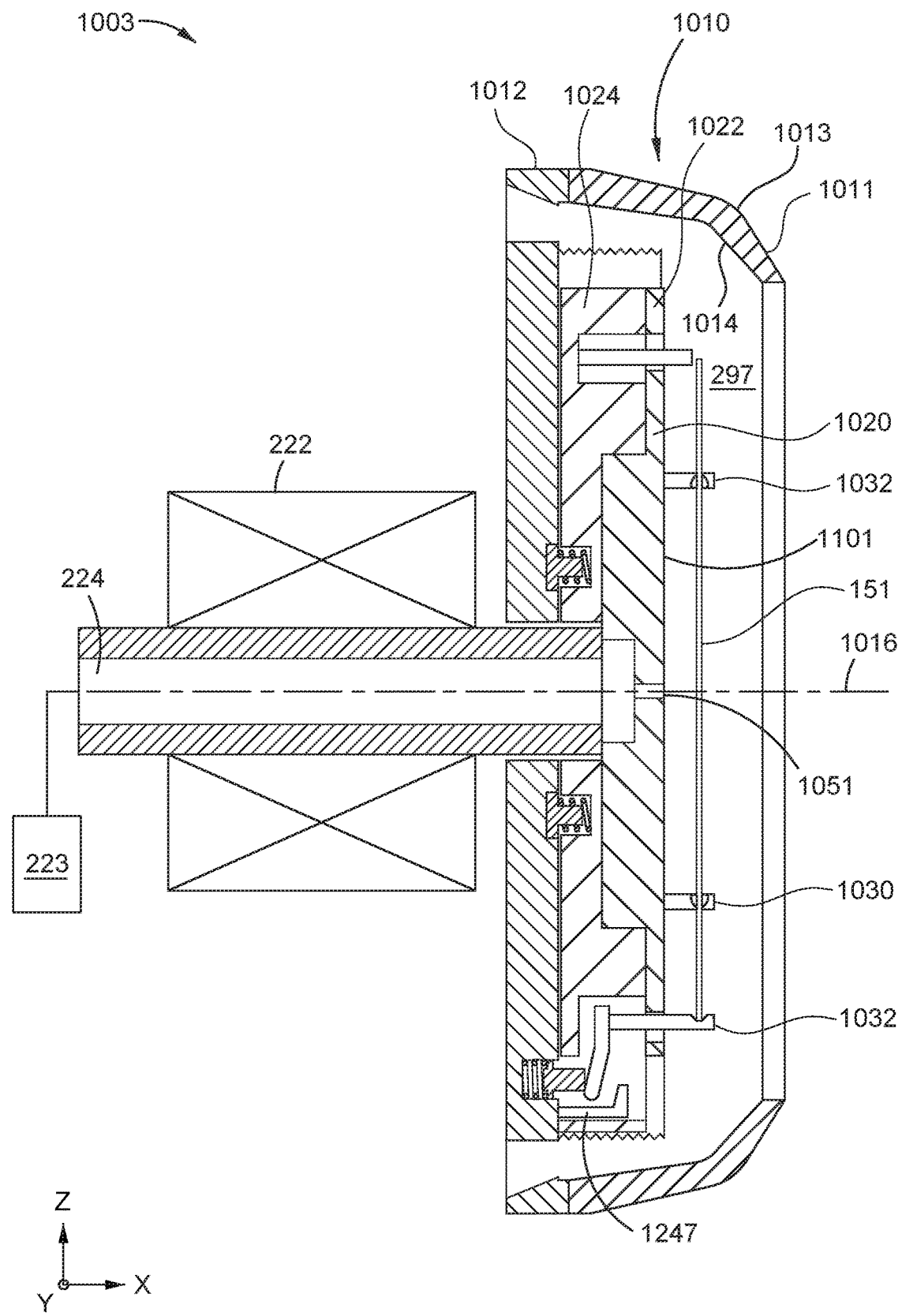
FIG. 11 is a schematic cross sectional side views of a wafer gripping device, according to one or more embodiments.

FIG. 11 illustrates an example of the wafer gripping device 1003, which is illustrated in FIG. 10. The gripper assembly 1020 is positioned within the processing volume 297 during the cleaning process. Further, the gripper assembly 1020 includes first plate assembly 1022, second plate assembly 1024, loading pins 1030, and gripping pins 1032. The first plate assembly 1022 is coupled to the shaft 224 which may be driven by the drive motor 222 to rotate the first plate assembly 1022, the second plate assembly 1024, and the catch cup 1010 during the cleaning cycle Further, the drive motor 222 may move the shaft 224 horizontally along axis 1016 to move the gripper assembly 1020 in and out of a loading position and a cleaning position. Further, cleaning fluids may flow through the shaft 224 such that they are applied to the backside of the wafer 151 via the aperture 1051 in the first plate assembly 1022 during the cleaning process. In one embodiment, the shaft 224 may be a spline shaft that allows the gripper assembly 1020 to be driven while the shaft 224 is translated in the +X and −X directions.

The annular inner surface 1014 of the wall 1013 may be shaped to aid in guiding moisture away from the wafer 151 during cleaning and into the drain 284 and reducing particle reattachment on the wafer 151. For example, the annular inner surface 1014 may include a first angled portion and a second angled portion to aid in guiding moisture away from the wafer 151 during cleaning. The first angled portion may be larger than the second angled portion. Further, the angle of the second angled portion with reference to the surface 1101 of the first plate assembly 1022 may be greater than the angle of the first angled portion with reference to the surface 1101 of the first plate assembly 1022.

The catch cup 1010 may be configured include a first catch cup 1011 and a second catch cup 1012. The first catch cup 1011 may be attached to the second catch cup 1012. For example, the first catch cup 1011 may be attached to the second catch cup 1012 via one or more bolts or similar attachment device. The first catch cup 1011 and or the second catch cup 1012 may include one or more threaded portions configured to receive a threaded bolt. Alternatively, the catch cup 1010 may be formed from a single piece of material.

The second catch cup 1012 may include the drain holes 262 of FIG. 7B. The drains holes 262 may be positioned in an array along the edge of the catch cup 1010 such that moisture flows into the drain 284 while the wafer 151, the gripper assembly 220, and the catch cup 1010 are rotated by the drive motor 222. Further, the drain holes 262 may be positioned in an array along the edge of the second catch cup 1012. The moisture flows through drain holes 262 into the drain 284 where it is removed from the cleaning module 1000.

Figure 12A:
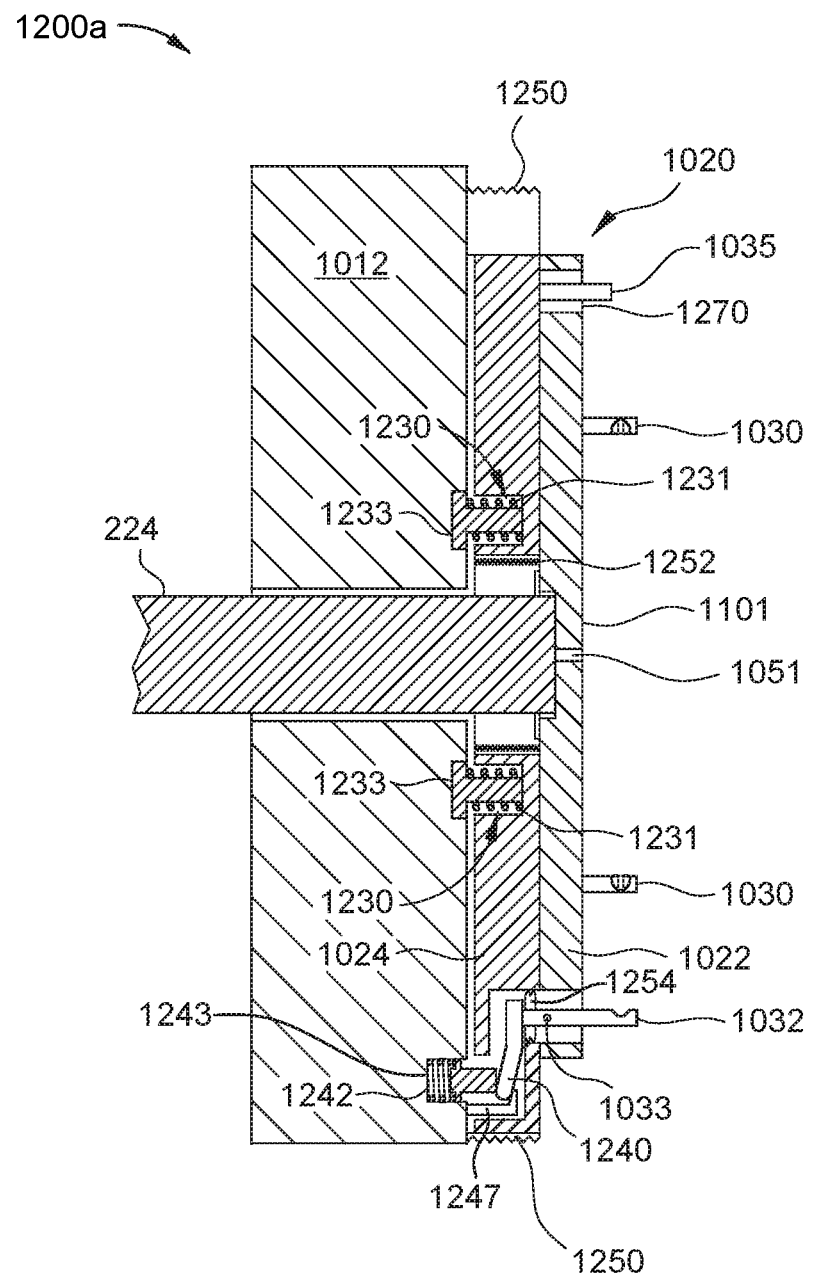
FIGS. 12A and 12B illustrate various views of a gripper assembly, according to one or more embodiments.
Figure 12B:
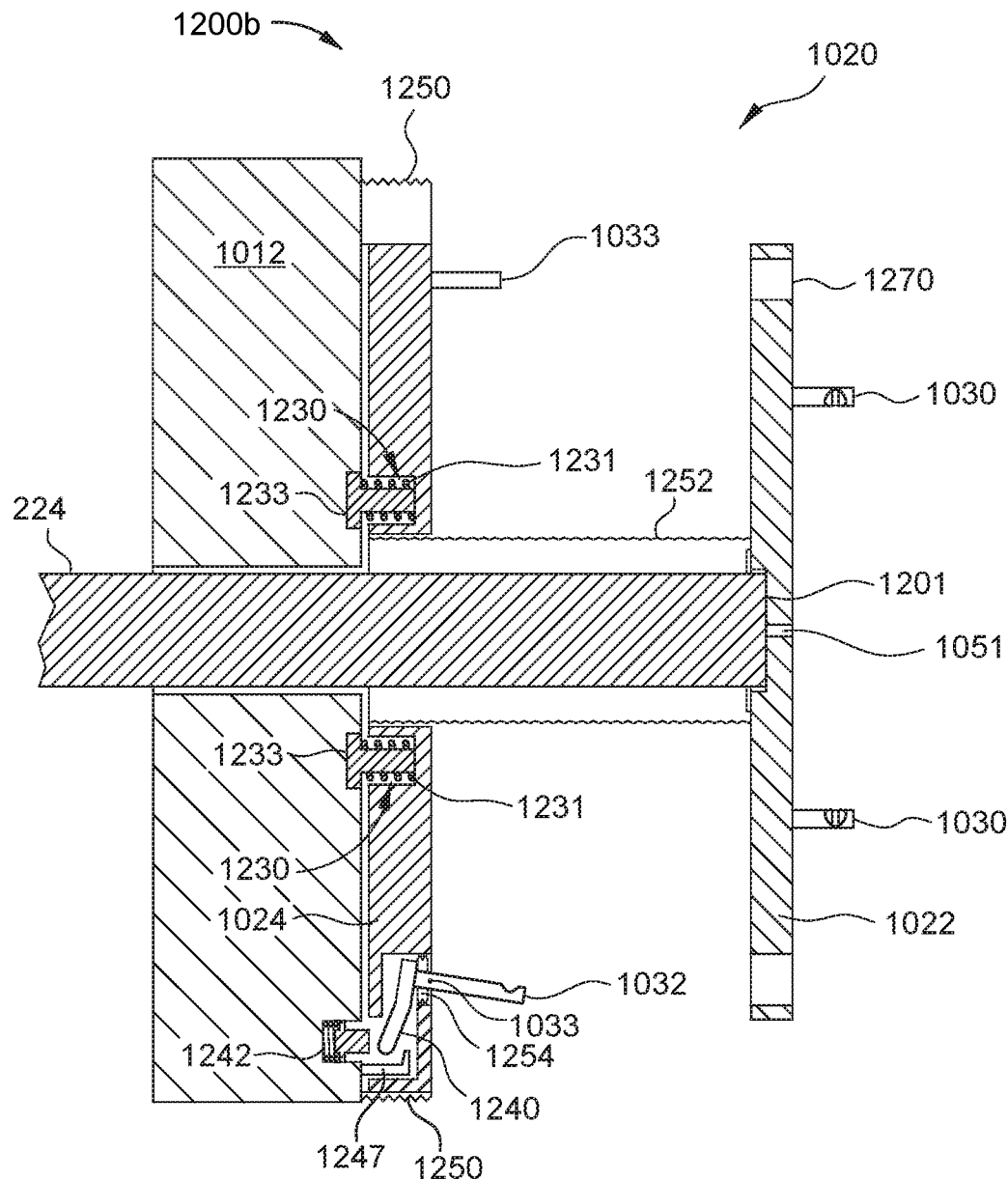

The first plate assembly 1022 and the second plate assembly 1024 are configured to move relative to one another to aid in receiving the wafer 151 and placing the wafer 151 in a cleaning position. Specifically, FIGS. 12A and 12B illustrates an embodiment of the gripper assembly 1020 in a retracted position 1200a and an extended position 1200b, respectively. The gripper assembly 1020 may be positioned in the retracted position 1200a during a cleaning process. Further, the gripper assembly 1020 may be positioned in the extended position 1200b during a wafer loading process and/or a wafer removal (unloading) process. The extended position 1200b may correspond to a loading position of the gripper assembly 1020 within the cleaning module 1000. Further, when in the loading position, the gripper assembly 1020 may be positioned a distance in the X-direction from the cleaning position. The surface 1101 of the first plate assembly 1022 is coupled to and driven by the shaft 224.

The catch cup 1010 includes one or more spring mechanisms 1230 that are coupled the second plate assembly 1024. The spring mechanisms 1230 function to retain the second plate assembly 1024 within a specified distance of the catch cup 1010 and allow the second plate assembly 1024 to move relative to the catch cup 1010. In embodiments where the catch cup 1010 comprises the first catch cup 1011 and the second catch cup 1012, the one or more spring mechanisms 1230 are disposed within the second catch cup 1012.

The spring mechanisms 1230 will typically include a spring 1231 and a coupling member 1233. The spring mechanisms 1230 allow the second plate assembly 1024 to move relative to the catch cup 1010 (or the second catch cup 1012) when the first plate assembly 1022 is driven horizontally by shaft 224. For example, as the first plate assembly 1022 is moved into the extended (e.g., loading or unloading position) position 1200b, the spring mechanism 1230 expand, moving the second plate assembly 1024 away from the catch cup 1010 (or the second catch cup 1012). Each of the spring mechanisms 1230 may include one or more springs 1231 that move over or in parallel to the coupling member 1233. The axial motion of the second plate assembly 1024 may be limited by the coupling members 1233.

One or more actuator pins 1242 may be disposed within the catch cup 1010 (or the second catch cup 1012). The actuator pins 1242 may be coupled to a spring element 1243. Alternatively, the actuator pins 1242 may be omitted and only the spring elements 1243 used. Further, the number of actuator pins 1242 is equal to the number of gripping pins 1032. For example, each actuator pin 1242 may be configured to interact with a corresponding one of the gripping pins 1032.

The gripper assembly 1020 may include loading pins 1030 and gripping pins 1032. The loading pins 1030 may be configured to receive and hold the wafer 151 during a loading process and to hold the wafer 151 during an unloading process. The loading pins 1030 may be fixed to the first plate assembly 1022.

The gripping pins 1032 may include one or more elements 1240 configured to impart motion onto the gripping pins 1032. For example, the gripping pins 1032 may be configured such that the distance between each gripping pin 1032 and a center of gripper assembly 1020 is variable. Further, the gripping pins 1032 may be coupled to the second plate assembly 1024. For example, the second plate assembly 1024 may include a cavity in which the gripping pins 1032 are disposed. The gripping pins 1032 may grip a wafer (e.g., wafer 151) during the cleaning process.

The gripper assembly 1020 may include one or more loading pins 1030 and one or more gripping pins 1032. For example, the gripper assembly 1020 may include at least three gripping pins 1032 and at least three loading pins 1030. The gripping pins 1032 may be disposed such that each pin is at about 120° with another gripping pin. Alternatively, the gripping pins 315 may be disposed at other angles with each other. Further, the loading pins 1030 may be disposed such that each pin is at about 120° with another loading pin. Alternatively, the loading pins 1030 may be disposed at other angles with each other. Additionally, the gripping pins 1032 may be disposed according to a first angle and the loading pins 1030 may be disposed according to a second angle different than the first angle. The number of the gripping pins 1032 may be greater than the number of the loading pins 1030. Alternatively, the gripping pins 1032 is equal to or less than the number of loading pins 1030.

The gripping pins 1032 may be moved between a loading or unloading position and a gripping position. For example, as the element 1240 disengages from actuator pin 1242 and engages with stopper 1247, the gripping pin 1032 is moved between a gripping position and a loading position. The gripping pin 1032 is shown as being in a gripping position in the embodiment of FIG. 12A and a loading position in the embodiment of FIG. 12B.

The stopper 1247 may be part of the catch cup 1010. Alternatively, the stopper 1247 is attached to the catch cup 1010. Further, at least a portion of the stopper 1247 may positioned within the cavity 1246. For example, the stopper 1247 may include a protrusion that is positioned within the cavity and interacts with the element 1240 to control the movement of the gripping pin 1032. The distance between the protrusion of the stopper 1247 and the actuator pin 1242 may define the amount of movement of the gripping pin 1032. For example, as the distance between the protrusion of the stopper 1247 and the actuator pin 1242 optimized, the gripping pin 1032 is allowed a larger amount of movement. Further, while a single stopper 1247 is shown, the gripping assembly 1020 may include a stopper 1247 for each gripping pin 1032.

The gripping pins 1032 may be moved to the gripping position in response to the first plate assembly 1022 imparting motion onto the second plate assembly 1024. For example, when the first plate assembly 1022 is driven by the shaft 224 into the retracted position (e.g., cleaning position) 1200a or into the extended position (e.g., loading or unloading position). When placing the gripper assembly into the cleaning position, force applied by the first plate assembly 1022 onto the second plate assembly 1024 may cause the spring mechanisms 1230 to compress allowing axial motion of the second plate assembly 1024 and the element (e.g., the actuation element) 1240 to contact the pin (e.g., the actuator pin) 1242, causing the gripping pin 1032 to pivot about axis 1033 toward the center of the assembly rotation.

Gripping force may be defined by the compression of the spring element 1243. Further, compression of the spring element 1243 depends on the distance between the second plate assembly 1024 and the second catch cup 1012. When placing the gripper assembly 1200 into extended position, the first plate assembly 1022 disengages from the second plate assembly 1024 allowing the spring mechanism 1230 to expand and move the second plate assembly 1024 and the element 1240 away from the second catch cup 1012. The element 1240 may disengage from the actuator pin 1242 and contact the stopper 1247, causing the gripping pin 1032 to pivot about axis 1033 away from the center of the rotation of the gripper assembly 1200. Further, axial motion of the second plate assembly 1024 may be limited by the coupling member 1233. The position of the gripping pin 1032 may correspond to the distance between the second plate assembly 1024 and the second catch cup 1012 and defined by engagement of element 1240 with the pin 1242 and/or the stopper 1247, and/or the placement of the element 1240 within the gripping pin 1032. The distance between the gripping pins 1032 may be reduced when the gripping pins 1032 are in the gripping position as compared to when the gripping pins 1032 are in the loading or unloading position.

The pins 1030 and 1032 may be configured to hold the wafer 151 such that the wafer 151 does not contact the first plate assembly 1022. The distance between the wafer 151 and the first plate assembly 1022 is fixed.

A bellows 1250 is disposed around the second plate assembly 1024, and is configured to prevent moisture from entering any space between the second plate assembly 1024 and the catch cup 1010 (or the second catch cup 1012). The bellows 1250 may completely surround the second plate assembly 1024 or only partially surround the second plate assembly 1024. Further, the bellows 1250 may expand and compress in response to movement of the second plate assembly 1024. Additionally, the bellows may be coupled to the catch cup 1010 (or the second catch cup 1012).

A bellows 1252 may be coupled to the shaft 224 to prevent moisture from reaching the shaft 224 and/or flowing between the shaft 224 and the second plate assembly 1024 and/or the catch cup 1010 (or the second catch cup 1012). The bellows 1252 may completely or partially surround the shaft 224. Further, the bellows 1252 may expand and compress in response to motion of the shaft 224.

A bellows 1254 may be positioned with the cavity 1246 in which the gripping pin 1032 is positioned. The bellows 1254 may aid in prevent moisture from flowing into the cavity and between the cavity and the second catch cup 1012.

A flexion device may be disposed between the second catch cup 1012 and the second plate assembly 1024. The flexion device may be configured to exert force onto the second plate assembly 1024 to aid in moving the second plate assembly 1024 away from the catch cup 1010 (or the second catch cup 1012).

The gripper assembly 1020 may further include guide pin 1035. The guide pin 1035 may be coupled to the second plate assembly 1024 and configured to guide motion and alignment of the first plate assembly 1022 and the second plate assembly 1024. For example, as the first plate assembly 1022 moves closer to the second plate assembly 1024, the guide pin 1035 passes through cavity 1270, aligning the first and second plate assemblies 1022, 1024. In addition, guide pin 1035 may be configured to restrict angular motion of the second plate assembly 1024 relative to the first plate assembly 1022. The gripper assembly 1020 may include one or more guide pins 1035, or none.

FIG. 12B illustrates the gripper assembly 1020 in the extended (e.g., loading or unloading) position 1200b. As is illustrated, the gripping pins 1032 have moved to the loading position in response to the movement of the second plate assembly 1024 away from the catch cup 1010 (or the second catch cup 1012). For example, the spring mechanisms 1230 have expanded in response to the first plate assembly 1022 being moved away from the second plate assembly 1024, pushing the second plate assembly 1024 away from the catch cup 1010 (or the second catch cup 1012). Further, the elements 1240 disengage from the actuator pins 1242 and engage with stoppers 1247 and move the gripping pins 1032 into the loading position. Further, the bellows 1250 and the bellows 1252 expand with movement of the second plate assembly 1024 and the shaft 224 respectively.

Cleaning fluids may flow onto a backside of wafer 151 through the one or more apertures 1051. The cleaning fluids may be a rinsing agent (e.g., DI water or Ozonated water) or a cleaning chemical. Further, the cleaning fluids may be provided via shaft 224 and then to the one or more apertures 1051. As illustrated, the one or more apertures 1051 may be utilized to flow chemicals onto the backside of the wafer 151. The one or more apertures 1051 may be formed in first plate assembly 1022. The number of apertures 1051 is one or more. Further, the one or more aperture 1051 may be disposed in a substantially circular or linear pattern. In one embodiment, each of the one or more apertures 1051 may be substantially the same size such that the cleaning fluid flows evenly across the back surface of the wafer 151. In other embodiments, at least one of the one or more apertures 1051 may be of a different size than at least one other aperture.

Figure 13:
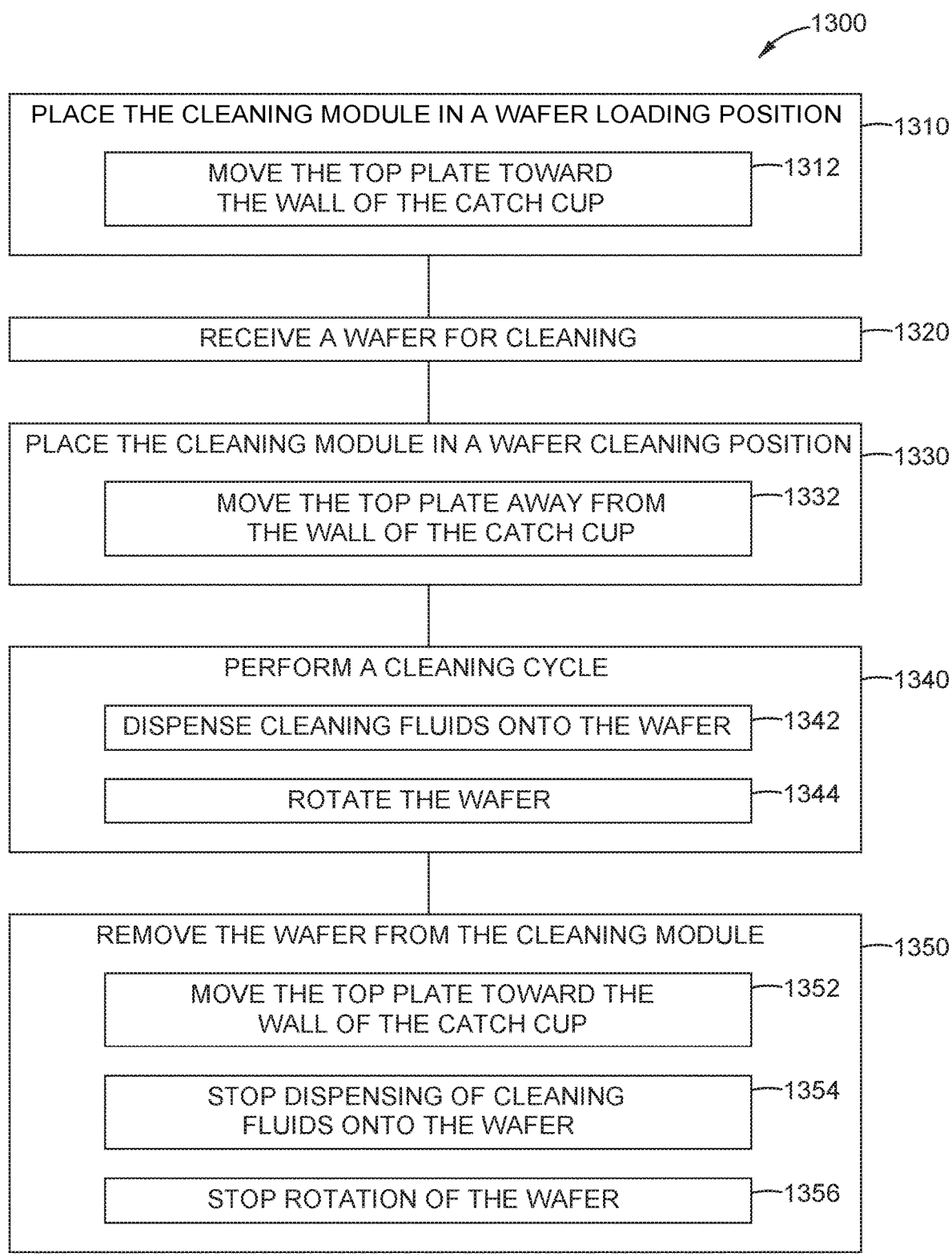
FIG. 13 illustrates a method for cleaning a wafer, according to one or more embodiments.

FIG. 13 illustrates method 1300 for cleaning a wafer (e.g., wafer 151). At operation 1310, a cleaning module is placed in a wafer loading position. For example, the lid 202 is opened and the first plate assembly 1022 of the gripper assembly 1020 of cleaning module 1000 is moved in a lateral direction (e.g., X direction) toward the wall 213 to place the gripper assembly 1020 in a loading position. Placing the gripper assembly 1020 in the loading position includes moving the first plate assembly 1022 via shaft 224 and drive motor 222 toward the wall 213 (operation 1312). For example, the drive motor 222 may drive the shaft 224 in the lateral direction moving the first plate assembly 1022 toward the wall 213 such that, the first plate assembly 1022 separates from the second plate assembly 1024. Further, the spring mechanisms 1230 expand in response to moving the first plate assembly 1022 away from the second catch cup 1012, allowing elements 1240 to place the gripping pins 1032 in the loading position.

Figure 14A:
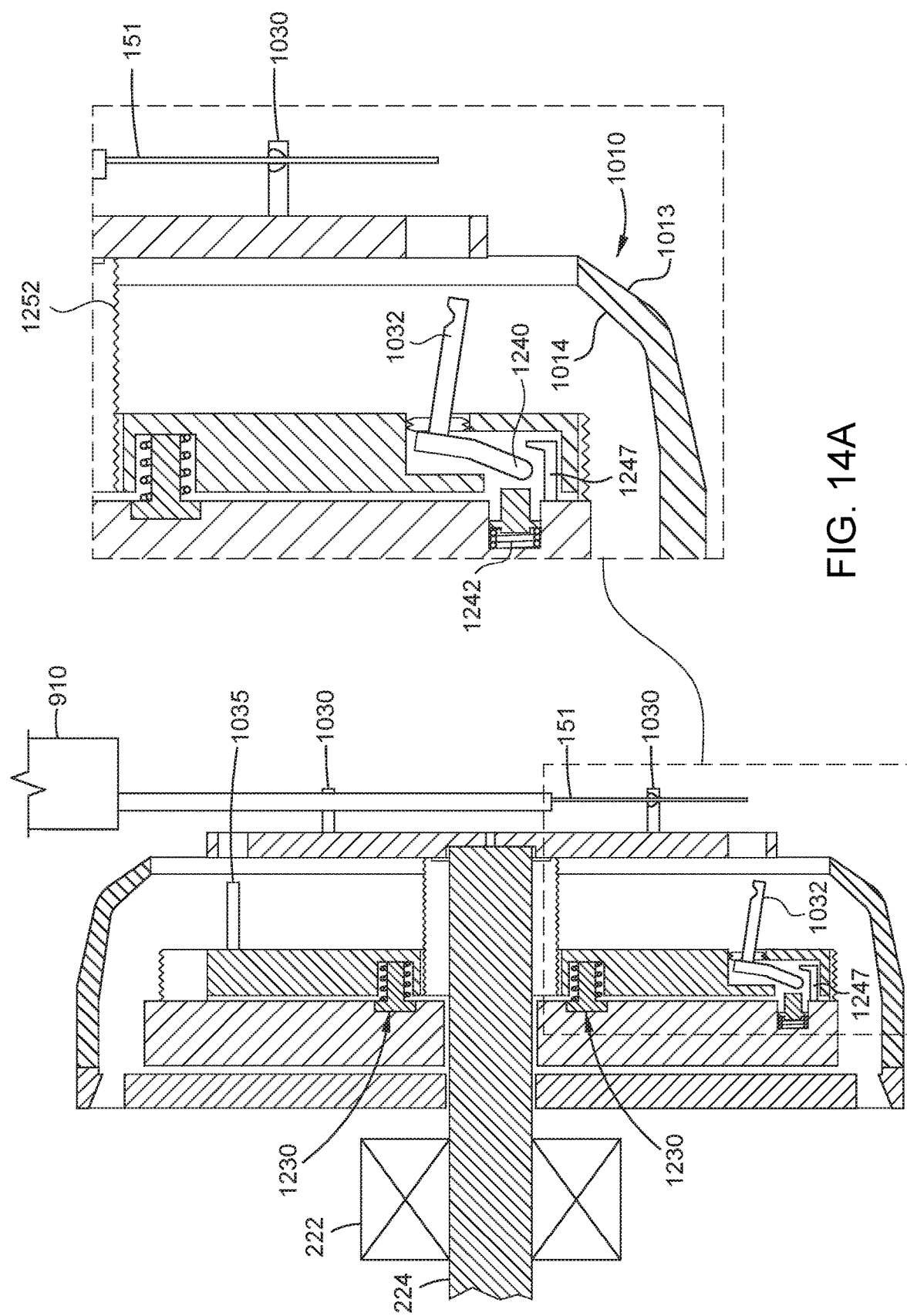
FIGS. 14A, 14B, and 14C illustrate various examples of a wafer gripping device, according to one or more embodiments.
Figure 14B:
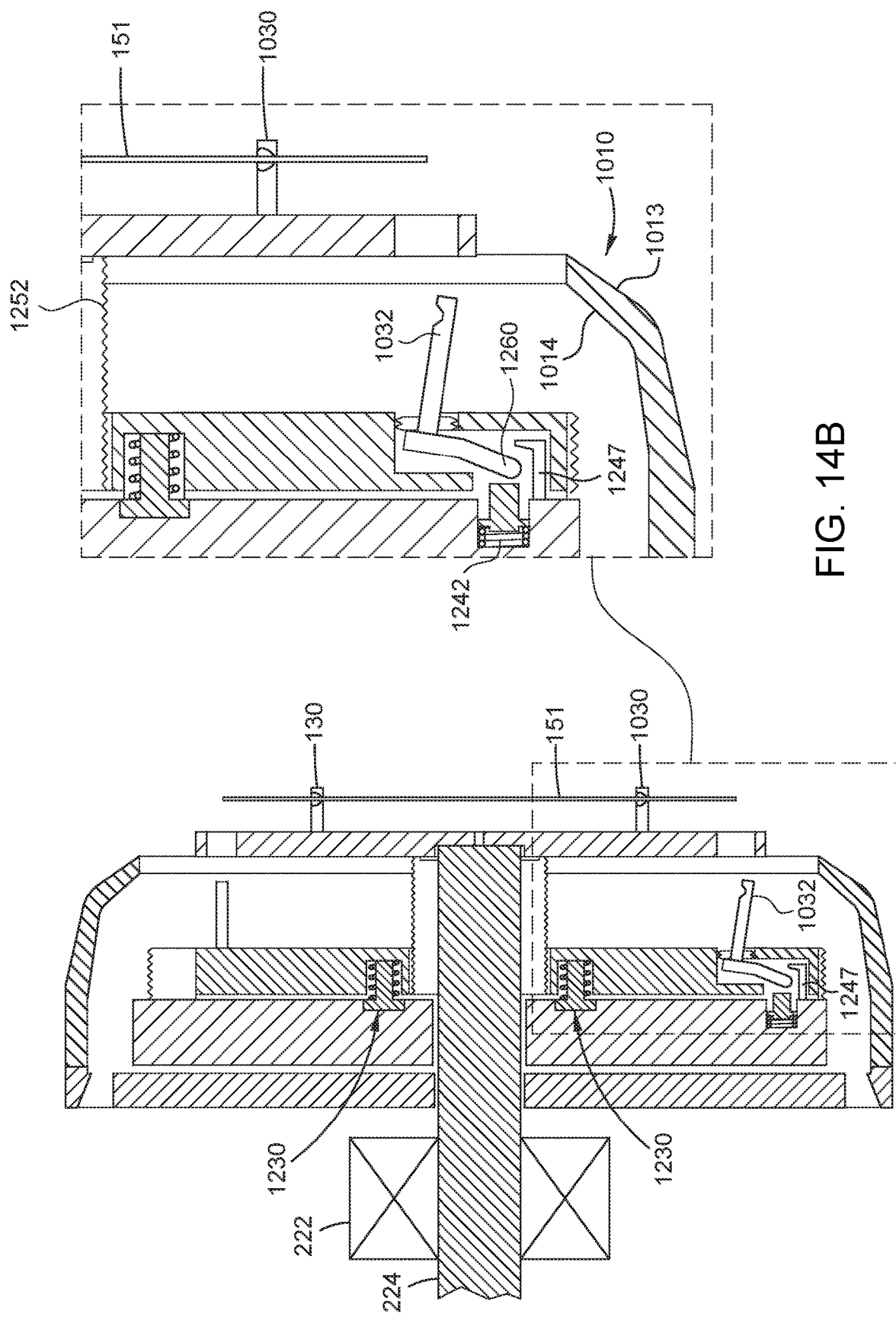
Figure 14C:
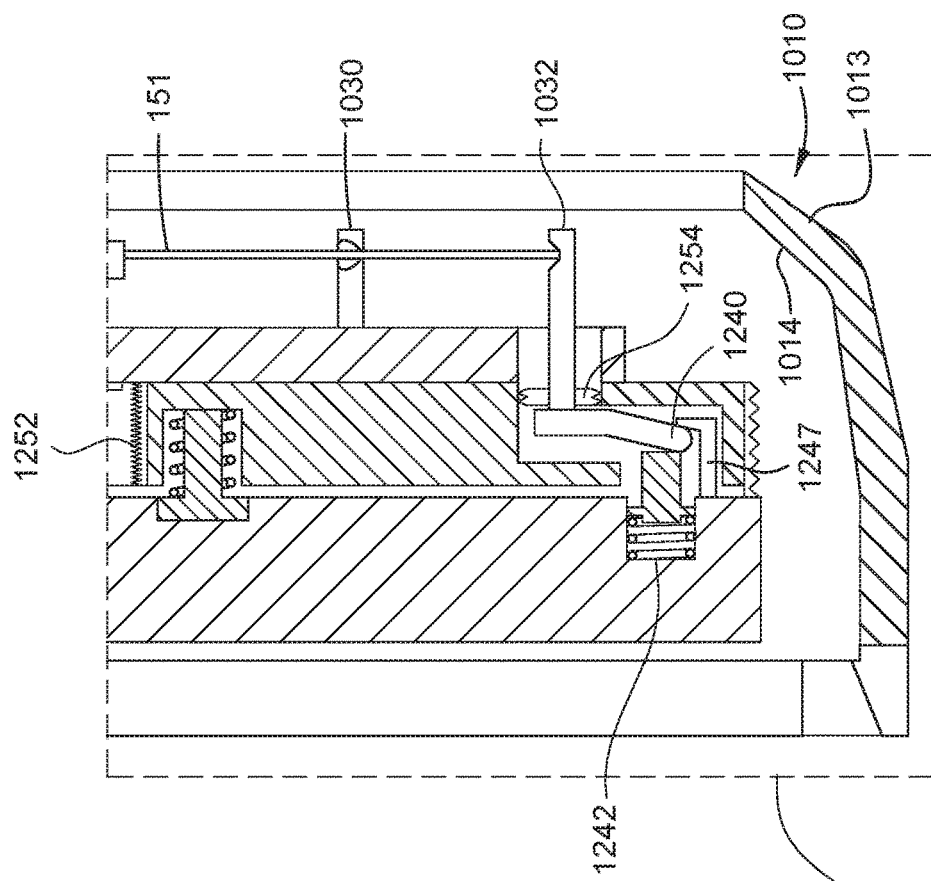
Figure 14C:
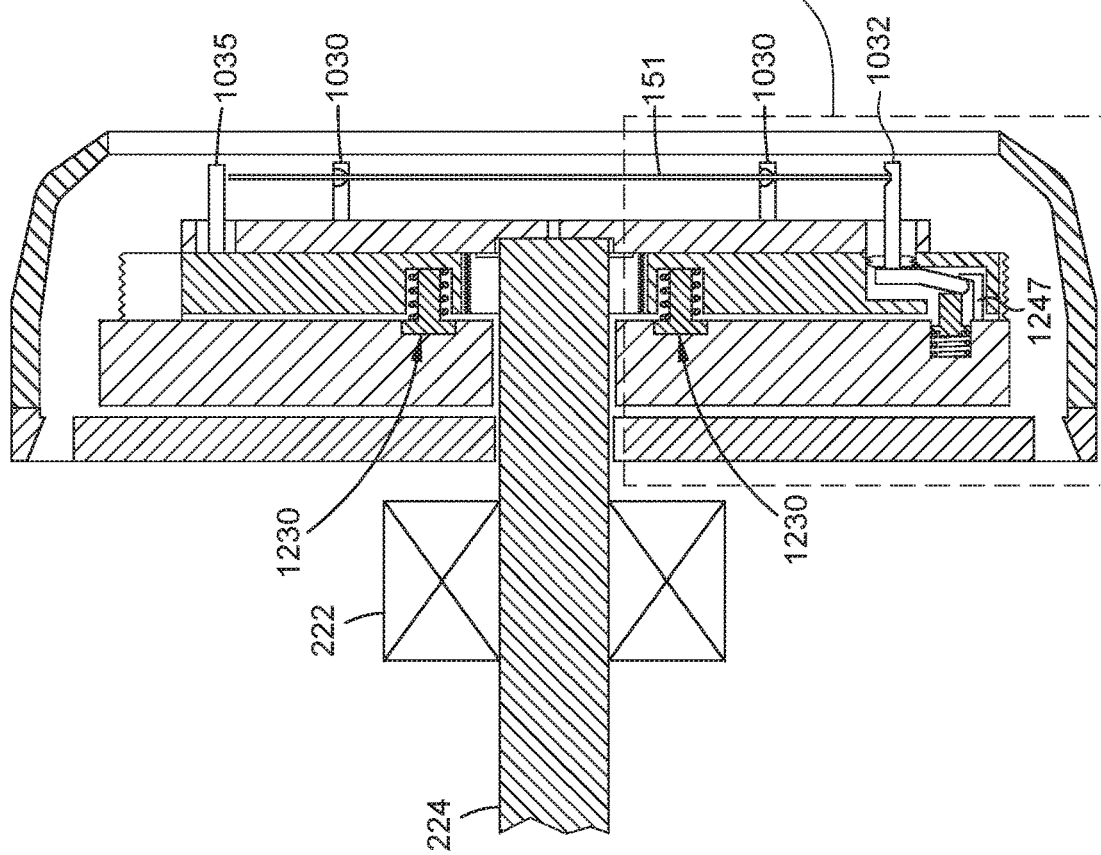

Each of the gripping pins 1032 is coupled to a respective element 1240, such that each of the gripping pins 1032 may be tilted (or moved) away from each other gripping pin 1032. For example, as is shown in FIG. 14A, in response to the first plate assembly 1022 separating from second plate assembly 1024, the elements 1240 engaged with the stoppers 1247, pivoted about axis 1033, and tilted the gripping pins 1032 away from the center of gripper assembly 1020. Moving the gripping pins 1032 includes moving the gripping pins 1032 toward the outer edge of the gripper assembly 1020 such that they are tilted away from the other gripping pins 1032 and the loading pins 1030, increasing the separation distance between the gripping pins 1032 and the distance between the gripping pins 1032 and the loading pins 1030.

The gripper assembly 1020 may be placed in the extended position 1200b such that the wafer 151 may be received for cleaning and/or the wafer 151 may be removed from the cleaning module 1000 after the cleaning cycle has been completed. For example the gripper assembly 1020 may be driven by the drive motor 222 and the shaft 224 such that at least a portion of the first plate assembly 1022 extends beyond the catch cup 1010 (or the first catch cup 1011), and is in the extended position 1200b. For example, at least one of the surface 1101 and the loading pins 1030 extend beyond the catch cup 1010 and into the interior volume 295. Alternatively, the surface 1101 may be disposed within the processing volume 297 while the loading pins 1030 are positioned within the interior volume 295.

The controller 190 may provide instructions to drive motor 222 to move the shaft 224 in the lateral direction, moving the gripper assembly 1020 in the horizontal direction along axis 1016. Further, the controller 190 may receive indicia indicating that the cleaning module 1000 is prepared to receive a wafer for cleaning. The indicia may be received as sensor data received from the sensing device 294.

At operation 1320 of the method 1300, a wafer is received for cleaning. For example, in one embodiment, the robot 910 inserts the wafer 151 into the gripper assembly 1020 for cleaning. For example, as is illustrated in the embodiment of FIG. 14A, the robot 910 inserts the wafer 151 such that it is held by (e.g., rests in grooves of) the loading pins 1030.

During entry into the cleaning module 1000 one or more spray bars 290 may pre-treat the wafer 151 by applying one or more fluids to the wafer 151 as it is inserted within the cleaning module 1000. The wafer 151 may be received after the wafer 151 has been cleaned within one or more other cleaning modules (e.g., megasonics cleaning modules 161, pre-clean modules 162, or brush box cleaning modules 164).

After the wafer 151 has been fully inserted into the loading pins 1030, the robot 910 releases the wafer 151 and the robot 910 is retracted from the cleaning module 1000.

Controller 190 provides instructions to the spray bars 290 to begin the pre-treatment process. Further, the controller 190 may receive indicia indicating that the wafer 151 has been inserted into the cleaning module 1000. The indicia may be received as sensor data from the sensing device 294.

At operation 1330 of the method 1300, a cleaning module is placed in a cleaning position. For example, the cleaning module 1000 may be placed in a cleaning position by moving the first plate assembly 1022 away from the wall 1013 and toward the second plate assembly 1024, as shown in operation 1332. The drive motor 222 drives shaft 224 to retract the first plate assembly 1022 of the gripper assembly 1020, moving the first plate assembly 1022 away from the wall 1013 and toward the second plate assembly 1024. For example, the drive motor 222 may drive the shaft 224 in a lateral or horizontal direction (e.g., X direction) to move the first plate assembly 1022 away from the wall 1013 and toward the second plate assembly 1024.

Further, as the drive motor 222 moves first plate assembly 1022 away from the wall 1013 and toward the second plate assembly 1024, the first plate assembly 1022 contacts the second plate assembly 1024, compressing spring mechanisms 1230. Further, as the first plate assembly 1022 imparts more force onto the second plate assembly 1024, and the spring mechanisms 1230 compress, the elements 1240 disengage from the stoppers 1247 and contact corresponding ones of actuator pins 1242, placing the gripping pins 1032 in a gripping position. In response, the gripping pins 1032 exert a gripping force or pressure onto the wafer 151. By varying the position of the second plate assembly 1024, the amount of gripping force applied by the gripping pins 1032 may be varied.

The controller 190 may be configured to provide instructions to drive motor 222 to move the shaft 224 in the lateral direction away from the wall 1013 and toward the second plate assembly 1024, moving the first plate assembly 1022 in the lateral direction toward the second plate assembly 1024 and away from the wall 1013. Once in the gripping assembly 1020 has been placed in the retracted position 1200b, a cleaning cycle may be initiated. The controller 190 may receive sensor data form the sensing device 294 indicating the gripper assembly 1020 is positioned in the retracted position 1200b (e.g., cleaning position) and initiate the cleaning cycle.

At operation 1340 a wafer is cleaned. The wafer 151 and the gripper assembly 1020 are placed in a cleaning position such that reside completely within processing volume 297. The wafer 151 may be cleaned by the cleaning module 1000. For example, performing the cleaning cycle may include dispensing fluids onto the surfaces of the wafer 151 as shown by operation 1342. Further, performing the cleaning cycle includes rotating the wafer 151 as shown by operation 1344.

Additionally, the position of the wafer 151 within the processing volume 297 may be altered during the cleaning process. For example, one or more of the distance between the second plate assembly 1024 and the catch cup 1010 (or the second catch cup 1012) and the amount at which the spring mechanisms 1230 are compressed may be varied, varying the position of the wafer 151 within the processing volume 297.

Cleaning the wafer 151 includes simultaneously rotating the catch cup 1010, the gripper assembly 1020, and the wafer 151 while cleaning fluids are applied to the first side (front surface) and second side (back surface) of the wafer 151. Simultaneously rotating the catch cup 1010, the gripper assembly 1020 and the wafer 151 while cleaning fluids are applied aids in minimizing and/or eliminating reattachment of particles to either surface of the wafer 151. For example, the drive motor 222 may be configured to rotate the catch cup 1010, the gripper assembly 1020 and the wafer 151. For example, the drive motor 222 may rotate shaft 224 to rotate the catch cup 1010, the gripper assembly 1020, and the wafer 151. The wafer 151 is rotated at a speed in a range of about 500 RPM to about 1000 RPM such that the fluids are removed from the surface of the wafer 151. The wafer 151 may be rotated at speeds either less than 500 RPM or greater than about 1000 RPM. Further, the rate at which the wafer 151 is rotated may be varied during the cleaning process. Additionally, once the wafer gripper 210 has been placed in the cleaning position, the cleaning cycle may be initiated.

First cleaning fluids may be applied to a back surface (e.g., surface adjacent the surface 1101) of the wafer 151 via fluid source 223, shaft 224 and aperture 1051. Further, second fluids may be applied to front surface (e.g., surface opposite the surface 1101) of the wafer 151 via the nozzle mechanism 240. The sweep arm drive motor 234 moves the sweep arm 230 such that the nozzle mechanism 240 is moved over the front surface of the wafer 151 in an arcuate path. The nozzle mechanism 240 may be configured to apply cleaning fluids to the front surface of the wafer 151 during the cleaning process. The fluids may include cleaning chemistries and/or rinsing agents. In one embodiment, the cleaning fluids may be applied to the front surface and the back surface of the wafer 151 at substantially the same time. Further, cleaning fluids may be applied to the front surface of the wafer 151 independent to that of applying cleaning fluids to the back surface of the wafer 151. For example, cleaning fluids may be applied to the back surface of the wafer 151 and cleaning fluids may be applied to the back surface of the wafer 151 during one or more overlapping and non-overlapping periods. During a first non-overlapping period one or more cleaning fluids may be applied to the front surface of the wafer 151, and during a second non-overlapping period one or more cleaning fluids may be applied to the back surface of the wafer 151. The overlapping and non-overlapping periods of a cleaning cycle may occur in any order. Further, the number and/or order of overlapping and non-overlapping periods may vary from cleaning cycle to cleaning cycle. While in the cleaning position, splashing of the cleaning fluids back onto the wafer 151 is at least reduced and, in various embodiments, eliminated.

During at least one of the cleaning process, the loading process and the unloading process airflow within the cleaning module 200 mitigates re-circulation from occurring, preventing particles from reattaching the surface of the wafer 151.

The controller 190 may receive indicia indicating that the gripper assembly 220 is positioned in the cleaning position. For example, the controller 190 may receive sensor data from the sensing device 294. Further, the controller 190 may be configured to control flow of the cleaning fluids through the shaft 224 and the aperture(s) 1051 as well as the motion of and control of fluids through nozzle mechanism 240. The controller 190 may provide instructions to the sweep arm drive motor 234 to move the nozzle mechanism 240 across the surface of the wafer 151. Further, the controller 190 may output instructions to the nozzle mechanism to dispense cleaning fluids from one or more of the nozzles. Further, the controller 190 may control the timing of the nozzles, such that cleaning fluids are output at different times. For example, one nozzle may be controlled to start dispensing cleaning fluids before another nozzle. One or more of the nozzles may be configured to output a cleaning fluid while at least another one of nozzles does not output a cleaning fluid.

At operation 1350 a cleaned wafer is removed from the cleaning module. Removing the wafer from the cleaning module 1000 includes moving the first plate assembly 1022 of the gripper assembly 1020 away from the second plate assembly 1024 of the gripper assembly 1020 (operation 1352). As the first plate assembly 1022 is moved away from the second catch cup 1012, the spring mechanism 1230 expands, imparting force onto the second plate assembly 1024. In response, the second plate assembly 1024 moves in the same direction as the first plate assembly 1022 is moved, and the force exerted onto the elements 1240 by the actuator pins 1242 decreases. Further, as the second plate assembly 1024 moves the elements 1240 engage with the stoppers 1247 and moved gripping pins 1032 into the loading position, releasing the grip of the gripping pins 1032 on the wafer 151 and unloading the wafer 151 onto the loading pins 1030.

Further, removing the wafer 151 from the cleaning module includes operation 1354, stopping dispensing of the cleaning fluids, and operation 1356, and stopping rotation of the wafer.

At the end of the cleaning cycle, the gripper assembly 1020 is moved into the loading position by the drive motor 222 and shaft 224. Further, the nozzle mechanism 240 may cease spraying fluids and the nozzle mechanism 240 and the sweep arm 230 may be moved away from the catch cup 1010 at the end of the cleaning cycle and before the first plate assembly 1022 is moved, moving the nozzle mechanism 240 and the sweep arm 230 away from the movement path of the first plate assembly 1022. For example, at the end of the cleaning cycle, the nozzle mechanism 240 and the sweep arm 230 may be positioned such that they do not interfere with movement of the gripper assembly 1020 and robot 910.

Drive motor 222 and shaft 224 may be configured to move the first plate assembly 1022 in a lateral direction toward the wall 1013, causing the first plate assembly 1022 to separate from the second plate assembly 1024, and placing the gripping pins 1032 in a loading position. Further, the wafer 151 is moved within the interior volume 295. Additionally, the spray bars 290 may be engaged during the unloading process to apply fluids to the wafer 151.

At the end of the cleaning cycle dispensing of the cleaning fluids via the shaft 224 and the nozzle mechanism 240 is stopped. Before the first plate assembly 1022 is moved toward the wall 1013, the dispensing of the cleaning fluids is stopped. Fluids may be continued to be disposed onto the back surface of the wafer 151 while dispensing of the fluids to the front surface is stopped.

Further, after the gripper assembly 1020 has been placed in the unloading position, the wafer 151 may be removed.

FIG. 14A illustrates an example where the gripper assembly 1020 is positioned in the unloading position such that robot 910 may remove the wafer 151 from the cleaning module 1000. In one embodiment, robot 910 may access the cleaning module through the opening unobstructed by lid 202, pick up the clean wafer 151 and remove the clean wafer 151 from the cleaning module 200.

The controller 190 may provide instructions to the drive motor 222 to move the shaft 224 in the lateral direction toward the first catch cup 211, moving the first plate assembly 1022 in the lateral direction and toward the wall 1013 to place the gripper assembly 1020 in an unloading position such that the robot 910 may remove the cleaned wafer 151 from the cleaning module 1000. Further, the controller 190 may provide instructions to the drive motor 222 to stop rotation of the catch cup 1010 and the gripper assembly 1020, once the wafer 151 is positioned in the interior volume 295. The controller 190 may also provide instructions to the nozzle mechanism 240 and/or fluid source 223 to stop dispensing cleaning fluids. Further, the controller 190 may also provide instructions to the spray bars 290 to begin dispensing of fluids. For example, the controller 190 may instruct the spray bars 290 to begin dispensing fluids to coincide with the ending of the cleaning cycle, when the movement of the first plate assembly 1022 begins, when the first plate assembly 1022 clears the wall 1013, or at any other point during the unloading process.

While the foregoing is directed to embodiments of the present disclosure, other and further embodiments of the disclosure may be devised without departing from the basic scope thereof, and the scope thereof is determined by the claims that follow.

What is claimed is:

1. A cleaning module comprising:
a wafer gripping device configured to support a wafer in a vertical orientation, the wafer gripping device comprising:
a catch cup comprising a wall that has an annular inner surface, wherein the annular inner surface defines a processing region and the annular inner surface has an angled portion that is symmetric about a central axis of the wafer gripping device;
a gripper assembly configured to be positioned in at least one of a loading position, rinsing position, and a cleaning position, wherein the cleaning position of the gripper assembly is disposed within the processing region, the gripper assembly comprising:
a first plate assembly;
a second plate assembly, wherein the first plate assembly is configured to be moved in a horizontal direction with reference to the second plate assembly to position the gripper assembly in the at least one of the loading position, the rinsing position, and the cleaning position;
a gripping pin of the second plate assembly, wherein when the gripper assembly is in the loading position the gripping pin is a first distance from the central axis of the gripper assembly, and when the gripper assembly is in the cleaning position, the gripping pin is a second distance from the central axis of the wafer gripping device and contacts an edge of the wafer, wherein the first distance is greater than the second distance; and
a loading pin of the first plate assembly configured to contact the edge of the wafer, wherein when the gripper assembly is in the loading position and the cleaning position the loading pin is a third distance from the central axis.

2. The cleaning module of claim 1, wherein when the gripper assembly is disposed in the cleaning position the wafer is not in contact with the loading pin, and wherein the gripping pin is configured to contact the edge of the wafer to reduce interference of the wafer during a cleaning process.

3. The cleaning module of claim 2, wherein when the gripper assembly is disposed in the loading position, the loading pin is in contact with the edge of the wafer and configured to reduce interference of the wafer during the cleaning process by the loading pin.

4. The cleaning module of claim 1, further comprising an enclosure wall spaced apart from the catch cup, wherein an interior region is defined between the enclosure wall and the catch cup.

5. The cleaning module of claim 4, wherein the first plate assembly is:
at least partially positioned within the interior region and spaced apart from the second plate assembly when the gripper assembly is in the loading position; and
at least partially contacts the second plate assembly when the gripper assembly is in the cleaning position.

6. The cleaning module of claim 1, wherein the second plate assembly is coupled to the catch cup by one or more spring mechanisms, and wherein the one or more spring mechanisms are compressed when the gripper assembly is in the cleaning position.

7. The cleaning module of claim 1, wherein:
the catch cup further comprises an actuator pin; and
the gripping pin is coupled to an actuator element configured to:
engage with the actuator pin and position the gripping pin in the cleaning position when the gripper assembly is in the cleaning position; and
disengage from the actuator pin and position the gripping pin in the loading position when the gripper assembly is in the loading position.

8. The cleaning module of claim 1, wherein the catch cup further comprises:

one or more drain holes, wherein the annular inner surface is configured to guide moisture to the one or more drain holes as the catch cup is rotated about the central axis.

9. The cleaning module of claim 8 wherein each of the one or more drain holes is fluidly coupled to an interior region of the cleaning module through a respective air labyrinth shaped to mitigate moisture from flowing into the interior region.

10. The cleaning module of claim 9, wherein each of the one or more drain holes comprises a first wall and a second wall, wherein the first wall is tapered away from the second wall.

11. The cleaning module of claim 1 further comprising a bellows coupled to the second plate assembly and the catch cup.

12. The cleaning module of claim 1 further comprising:
a nozzle mechanism coupled to a sweep arm, the nozzle mechanism comprising:
   a first nozzle oriented at a first angle with a surface of the first plate assembly and configured to provide a high energy fluid; and
   a second nozzle oriented at a second angle with the surface of the first plate assembly, wherein the second angle differs from the first angle.

13. The cleaning module of claim 12, wherein the first nozzle is configured to apply a high energy cleaning fluid and the second nozzle is configured to apply a second fluid during a cleaning process.

14. The cleaning module of claim 12, wherein the first nozzle is one of a megasonic nozzle and a jet nozzle configured to deliver a mixture of gas and liquid, and wherein the sweep arm is configured to move the nozzle mechanism over at least a portion of the first plate assembly during a cleaning process.

15. The cleaning module of claim 1 further comprising a drive motor coupled to the wafer gripping device through a shaft and configured to simultaneously rotate the catch cup and the gripper assembly, about the central axis, during a cleaning process.

16. The cleaning module of claim 15, wherein a first bellows surrounds the shaft and is coupled to the first plate assembly and the catch cup, and wherein a second bellows surrounds one or more actuation elements within the gripper assembly and isolates the one or more actuation elements.

* * * * *